United States Patent
Shimotsusa et al.

(10) Patent No.: US 9,787,931 B2
(45) Date of Patent: *Oct. 10, 2017

(54) SOLID-STATE IMAGING DEVICE AND MANUFACTURING METHOD THEREFOR

(71) Applicant: CANON KABUSHIKI KAISHA, Tokyo (JP)

(72) Inventors: Mineo Shimotsusa, Machida (JP); Fumihiro Inui, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/239,530

(22) Filed: Aug. 17, 2016

(65) Prior Publication Data

US 2016/0360139 A1    Dec. 8, 2016

Related U.S. Application Data

(63) Continuation of application No. 14/555,352, filed on Nov. 26, 2014, now Pat. No. 9,450,012, which is a (Continued)

(30) Foreign Application Priority Data

Jun. 30, 2010    (JP) .................. 2010-149476

(51) Int. Cl.
*H01L 27/148*    (2006.01)
*H04N 5/378*    (2011.01)
*H01L 27/146*    (2006.01)

(52) U.S. Cl.
CPC ......... *H04N 5/378* (2013.01); *H01L 27/1463* (2013.01); *H01L 27/1464* (2013.01);
(Continued)

(58) Field of Classification Search
USPC .......................... 257/225, 233, 292, E27.133
See application file for complete search history.

(56) References Cited

U.S. PATENT DOCUMENTS 8,928,041 B2 * 1/2015 Shimotsusa ....... H01L 27/14609
257/225
9,450,012 B2 * 9/2016 Shimotsusa ....... H01L 27/14609
(Continued)

FOREIGN PATENT DOCUMENTS

EP    1883112 A1    1/2008
JP    2008277511 A    11/2008
(Continued)

*Primary Examiner* — Timor Karimy
(74) *Attorney, Agent, or Firm* — Canon USA, Inc. IP Division

(57) ABSTRACT

A solid-state imaging device includes a first and second pixel regions. In the first pixel region, a photoelectric conversion unit, a floating diffusion region (FD), and a transferring transistor are provided. In the second pixel region, an amplifying transistor, and a resetting transistor are provided. A first element isolation portion is provided in the first pixel region, while a second element isolation portion is provided in the second pixel region. An amount of protrusion of an insulating film into a semiconductor substrate in the first element isolation portion is smaller, than that in the second element isolation portion.

20 Claims, 20 Drawing Sheets

Related U.S. Application Data continuation of application No. 13/807,065, filed as application No. PCT/JP2011/003530 on Jun. 21, 2011, now Pat. No. 8,928,041.

(52) U.S. Cl.
CPC .. *H01L 27/14601* (2013.01); *H01L 27/14609* (2013.01); *H01L 27/14612* (2013.01); *H01L 27/14621* (2013.01); *H01L 27/14623* (2013.01); *H01L 27/14627* (2013.01); *H01L 27/14632* (2013.01); *H01L 27/14634* (2013.01); *H01L 27/14636* (2013.01); *H01L 27/14641* (2013.01); *H01L 27/14643* (2013.01); *H01L 27/14683* (2013.01)

(56) References Cited

U.S. PATENT DOCUMENTS

| | | |
|---|---|---|
| 2007/0194356 A1 | 8/2007 | Moon |
| 2009/0184349 A1 | 7/2009 | Dungan |

FOREIGN PATENT DOCUMENTS

| | | |
|---|---|---|
| JP | 2009-170448 A | 7/2009 |
| JP | 2010506404 A | 2/2010 |
| WO | 2007/105478 A1 | 9/2007 |
| WO | 2008/156274 A1 | 12/2008 |

* cited by examiner

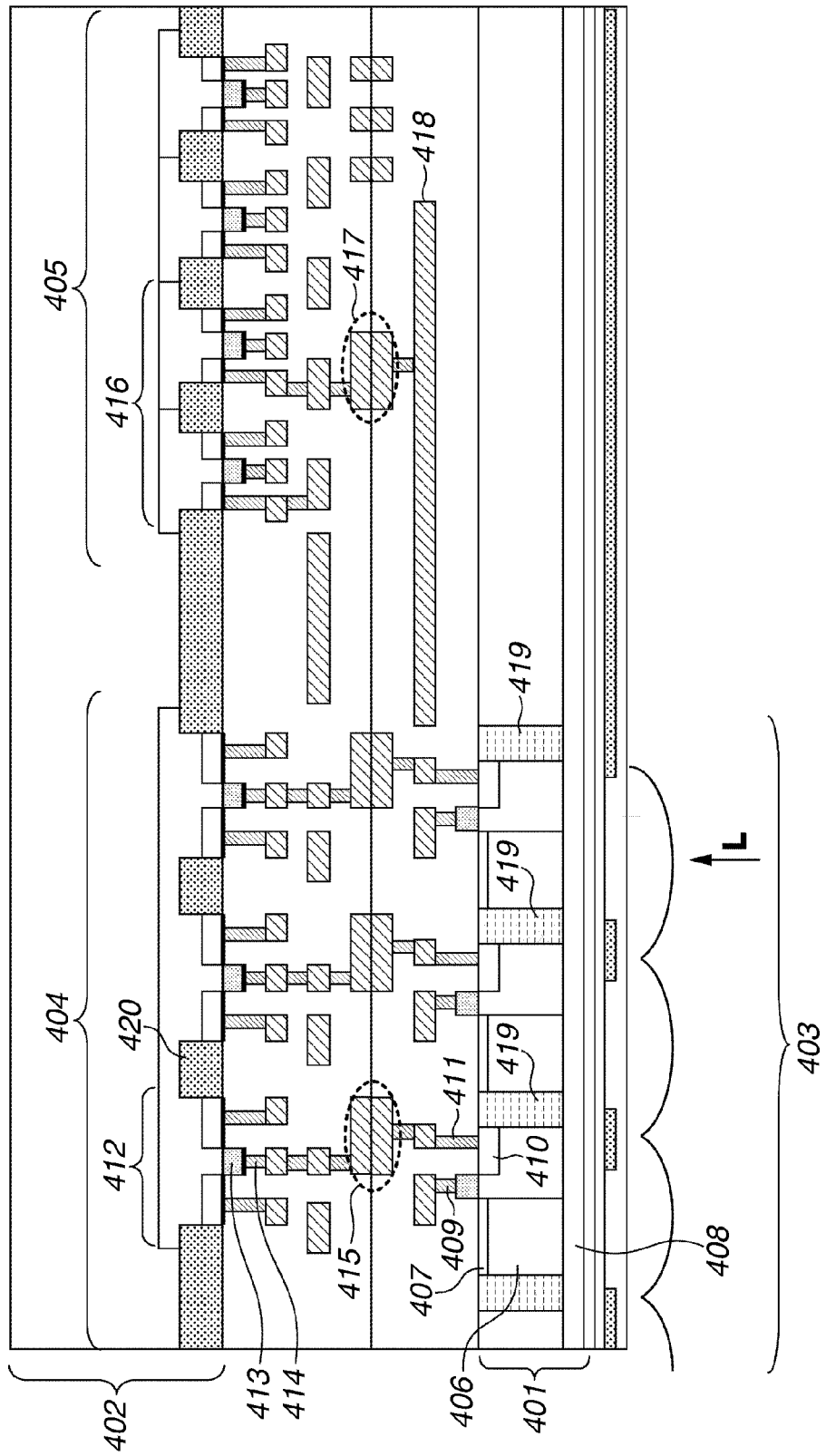

SOLID-STATE IMAGING DEVICE AND MANUFACTURING METHOD THEREFOR

CROSS-REFERENCE TO RELATED APPLICATION

This application is a Continuation of co-pending U.S. patent application Ser. No. 14/555,352, filed Nov. 26, 2014; which is a Continuation of U.S. patent application Ser. No. 13/807,065 filed Dec. 27, 2012, now becomes U.S. Pat. No. 8,928,041; issued Jan. 6, 2015; which is a National Phase application of International Application PCT/JP2011/003530, filed Jun. 21, 2011, which claims the benefit of Japanese Patent No. 2010-149476 filed Jun. 30, 2010. The disclosures of the above-named applications are hereby incorporated by reference herein in their entirety.

TECHNICAL FIELD

The present invention relates to a solid-state imaging device.

BACKGROUND ART

A configuration of a solid-state imaging device is known, in which a photoelectric conversion unit and a peripheral circuit unit are allocated to and formed on separate substrates, respectively, and connected electrically to each other by microbumps or the like.

Japanese Patent Application Laid-Open No. 2009-170448 discusses a back-side surface irradiation type solid-state imaging device configured such that a first semiconductor on which pixels each including a photoelectric conversion unit and a reading circuit for reading signals therefrom are arranged, is bonded to a second semiconductor on which a signal processing for processing signals read from the pixels is arranged. The reading circuit includes transistors such as a transferring transistor, an amplifying transistor, and a resetting transistor.

In the solid-state imaging device discussed in Japanese Patent Application Laid-Open No. 2009-170448, at least the resetting transistor is arranged on the first semiconductor substrate on which the photoelectric conversion unit is arranged. An element isolation structure according to element isolation due to insulating film arranged in the semiconductor substrate, such as local oxidation of silicon (LOCOS) isolation, or shallow trench isolation (STI), is necessary for element isolation of the resetting transistor or the amplifying transistor from the photoelectric conversion unit. Dark current is liable to be generated at an interface between the insulating film arranged in a semiconductor substrate and the semiconductor substrate. Accordingly, when the element isolation structure due to the insulating film arranged in the semiconductor substrate is used for element isolation of the photoelectric conversion unit, dark current easily flows into the photoelectric conversion unit. The dark current flowing into the photoelectric conversion unit causes noise. Noise generated at a preceding stage at which signals are amplified by the amplifying transistor dominantly affects image quality, as compared with noise generated at a subsequent stage of the amplifying transistor.

When the insulating film arranged in the semiconductor substrate is not used for element isolation of the resetting transistor and the photoelectric conversion unit, a wider element isolation region is needed to electrically isolate the resetting transistor and the photoelectric conversion unit from each other. Thus, if the light receiving area of the photoelectric conversion unit is set to be constant in order to maintain sensitivity of the photoelectric conversion unit, a pitch of the pixels increases. Consequently, it is difficult to miniaturize the pixels.

CITATION LIST

Patent Literature

[PTL 1]
Japanese Patent Application Laid-Open No. 2009-170448

SUMMARY OF INVENTION

The present invention aims at providing a solid-state imaging device favorable to reducing noise caused by dark current generated in an element isolation region for isolating a resetting transistor or an amplifying transistor from a photoelectric conversion unit, and to miniaturizing pixels.

According to an aspect of the present invention, a solid-state imaging device having a plurality of pixels each of which includes a photoelectric conversion unit, a floating diffusion region, a transferring transistor including a transferring gate electrode configured to transfer signal charge generated at the photoelectric conversion unit to the floating diffusion region, an amplifying transistor configured to output a signal based on an amount of electric charge of the floating diffusion region, and a resetting transistor configured to reset a voltage of the floating diffusion region. The solid-state imaging device further includes a first semiconductor substrate and a second semiconductor substrate. In the solid-state imaging device, a first insulating film is provided on a first principal surface of the first semiconductor substrate. The first semiconductor substrate includes a first pixel region. A plurality of photoelectric conversion units and a plurality of floating diffusion regions are arranged like a matrix on the first pixel region. A first element isolation portion for electrically isolating the plurality of photoelectric conversion units from the plurality of floating diffusion regions is arranged in the first pixel region. A second insulating film is arranged on the second semiconductor substrate. The second semiconductor substrate includes a second pixel region. A plurality of the amplifying transistors and a plurality of the resetting transistors are arranged on the second pixel region like a matrix. A second element isolation portion for electrically isolating the plurality of the amplifying transistors from the plurality of the resetting transistors is arranged in the second pixel region. An interface between the first semiconductor substrate and the first insulating film in the first element isolation portion is arranged at a first depth with respect to an interface between the first semiconductor substrate and the first insulating film in the photoelectric conversion unit. An interface between the second semiconductor substrate and the second insulating film in the second element isolation portion is arranged at a second depth with respect to an interface between the second semiconductor substrate and the second insulating film in a region in which the amplifying transistor is provided. The first depth is shallower than the second depth.

The solid-state imaging device according to the present invention can reduce noise caused by dark current generated in an element isolation region for isolating a resetting transistor or an amplifying transistor from a photoelectric conversion unit, and miniaturize pixels.

Further features and aspects of the present invention will become apparent from the following detailed description of exemplary embodiments with reference to the attached drawings.

BRIEF DESCRIPTION OF DRAWINGS

The accompanying drawings, which are incorporated in and constitute a part of the specification, illustrate exemplary embodiments, features, and aspects of the invention and, together with the description, serve to explain the principles of the invention.

FIG. 4 is a schematic diagram illustrating a cross-sectional structure of the first exemplary embodiment of the solid-state imaging device according to the present invention.

DESCRIPTION OF EMBODIMENTS

Various exemplary embodiments, features, and aspects of the invention will be described in detail below with reference to the drawings.

Hereinafter, a configuration of treating an electron as a signal charge is described by way of example. However, the present invention can be applied to a configuration treating a hole as a signal charge, by changing a conductivity type of a semiconductor region to an opposite conductivity type.

Figure 1A:
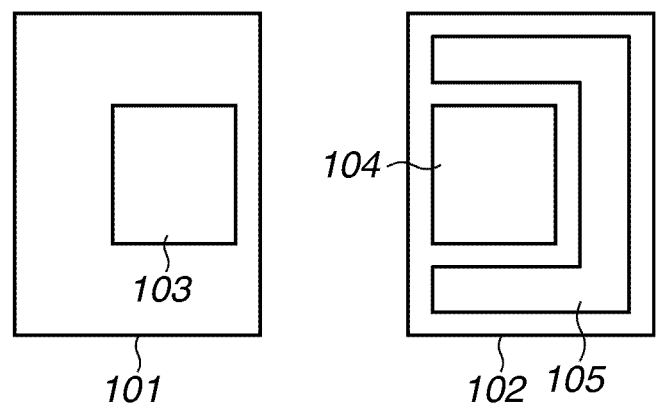
FIG. 1A is a schematic diagram illustrating planar configurations of substrates.

A first exemplary embodiment of a solid-state imaging device to which the present invention is applied is described hereinafter. FIG. 1A is a schematic diagram illustrating a planar configuration of each of a first and second semiconductor substrates included in a solid-state imaging device according the present exemplary embodiment. According to the present exemplary embodiment, components configuring one pixel are allocated to and provided on the first and second semiconductor substrates. A signal processing circuit for processing signals supplied from pixels is provided on the second semiconductor substrate.

A first semiconductor substrate 101 includes a first pixel region 103. Photoelectric conversion units are provided like a matrix on the first pixel region 103. The second semiconductor substrate 102 includes a second pixel region 104. A part of components included in the pixel are provided on the second pixel region 104. The second semiconductor substrate 102 includes a peripheral circuit 105. The signal processing circuit for processing signals supplied from pixels is provided on the peripheral circuit region 105. No photoelectric conversion units are provided on the second pixel region 104 and the peripheral circuit region 105. The first semiconductor substrate 101 and the second semiconductor substrate 102 are provided to face each other across wiring for electrically connecting circuits provided on both of the semiconductor substrates to each other.

Element isolation portions for electrically separating a plurality of photoelectric conversion units from one another or from other types of components of each pixel are provided in the first pixel region 103. Although details will be described below, a feature-part of the present exemplary embodiment resides in that the element isolation portions provided in the first pixel region 103 include no element isolation structure in which an insulating film is provided in the first semiconductor substrate 101.

Figure 2:
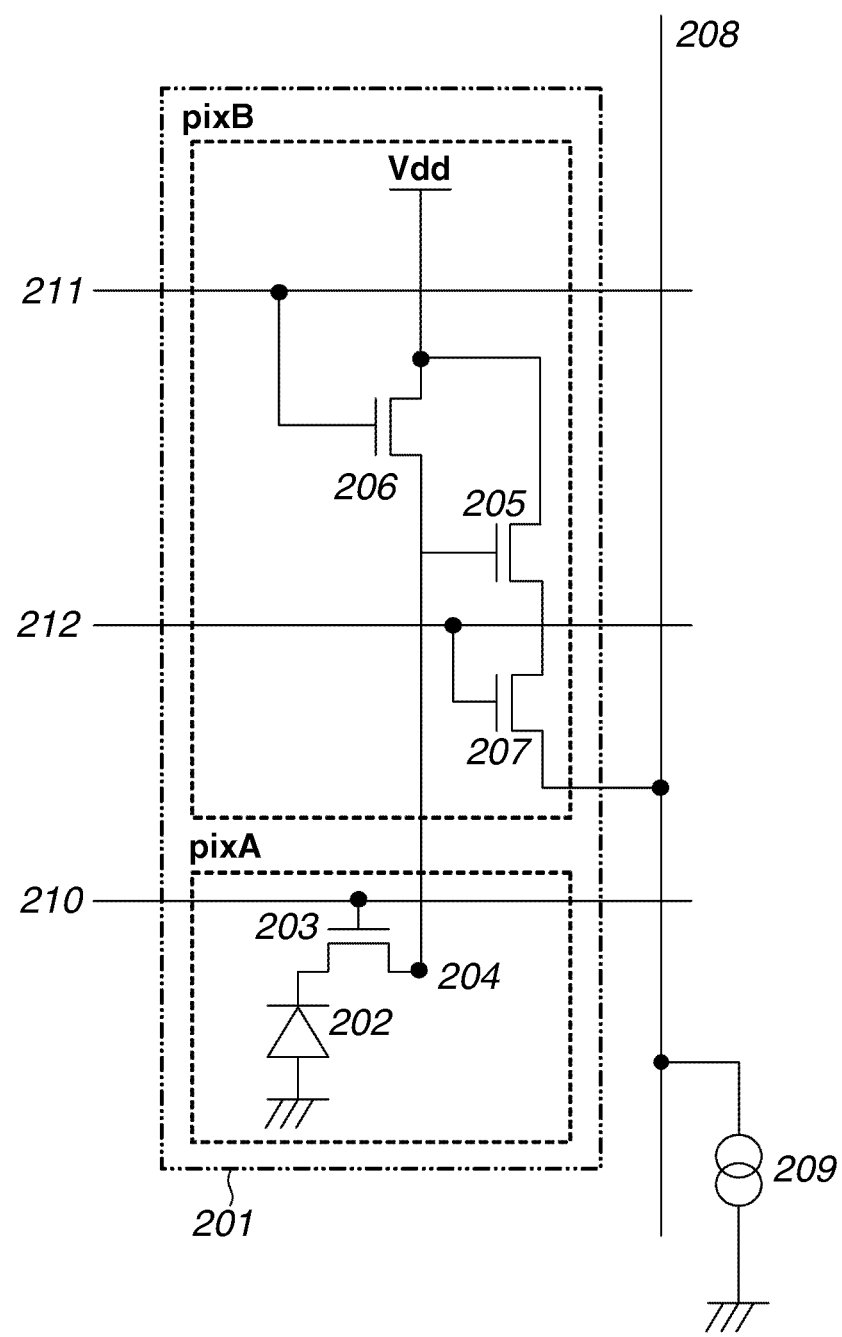
FIG. 2 is a circuit diagram illustrating an equivalent circuit of a pixel unit of a first exemplary embodiment of a solid-state imaging apparatus according to the present invention.

FIG. 2 illustrates an example of an equivalent circuit of a pixel according to the present exemplary embodiment. Although FIG. 2 illustrates only one pixel, pixels are actually provided like a matrix.

A pixel 201 includes a photoelectric conversion unit 202, a transferring transistor 203, a floating diffusion region (hereinafter referred to as FD) 204, an amplifying transistor 205, a resetting transistor 206, and a selecting transistor 207. The photoelectric conversion unit 202 is, e.g., a photodiode. The photoelectric conversion unit 202 performs photoelectric-conversion of incident light. Generated signal charges can be stored by the photoelectric conversion unit 202. The transferring transistor 203 transfers to the FD 204 the signal charges generated in the photoelectric conversion unit 202. The FD 204 is electrically connected to a gate of the amplifying transistor 205. The amplifying transistor 205 outputs a signal based on an amount of electric-charge of the FD 204. The resetting transistor 206 supplies the FD 204 with a voltage based on a resetting power supply, and resets a voltage of the FD 204. The selecting transistor 207 selects a pixel row from which signals are read.

Signals output from the amplifying transistor 205 are output to a vertical output line 208. A constant current source 209 is connected to the vertical output line 208. A source follower circuit is configured to include the amplifying transistor 205 and the resetting transistor 206. Each of control lines 210, 211, and 212 is connected to the gates of the transferring transistor 203, the resetting transistor 206, and the selecting transistor 207.

The photoelectric conversion unit 202, the transferring transistor 203, and the FD 204 are provided in the first pixel region 103 of the first semiconductor substrate 101 illustrated in FIG. 1A. The amplifying transistor 203, the resetting transistor 206, and the selecting transistor 207 are provided in the second pixel region 104 of the second semiconductor substrate 102 illustrated in FIG. 1A. The second pixel region 104 is an area differing from the first pixel region 103. An electrical connection portion between the first semiconductor substrate 101 and the second semiconductor substrate 102 is provided on an electrical path between the FD 204 and the gate of the amplifying transistor 205.

Each pixel according to the present exemplary embodiment includes the selecting transistor. However, the selecting transistor can be omitted. Although a configuration has been illustrated in FIG. 2, in which the selecting transistor 207 is provided on a path between a source of the amplifying transistor 205 and the vertical output line 208, the selecting transistor 207 can be provided on a path between a drain of the amplifying transistor 205 and a power supply 209. Alternatively, an analog-to-digital converter (hereinafter referred to as an ADC) for converting an analog signal output by the amplifying transistor 205 to a digital signal can be included in the pixel 201.

Figure 3:
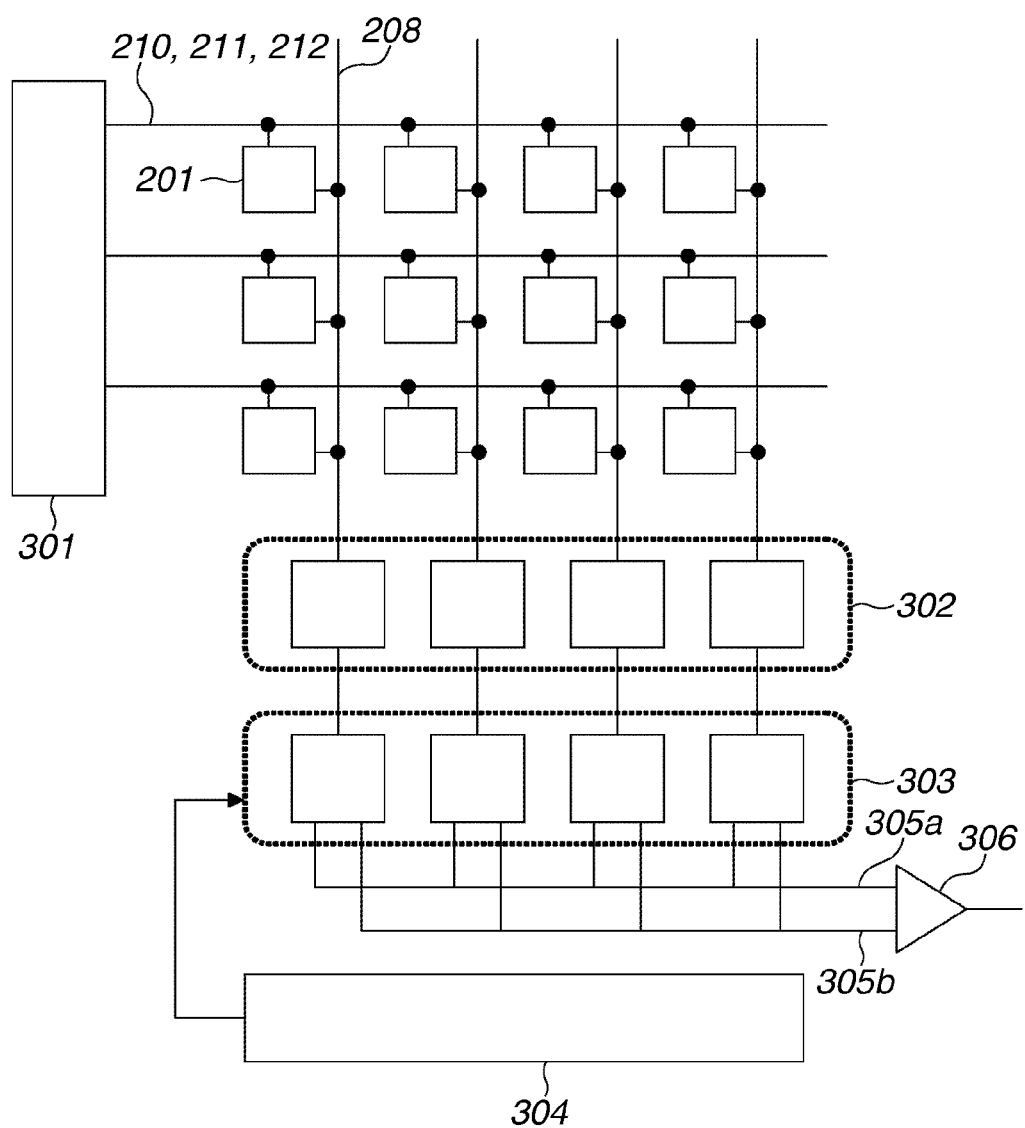
FIG. 3 is an equivalent circuit diagram illustrating an equivalent circuit of a signal processing circuit of the first exemplary embodiment of the solid-state imaging apparatus according to the present invention.

FIG. 3 illustrates an equivalent circuit of a set of each pixel 201 and the signal processing circuit according to the present exemplary embodiment. The pixels 201 illustrated in FIG. 2 are arranged like a matrix. Output nodes of a plurality of pixels 201 included in a single pixel column are connected to the single vertical output line 208. As illustrated in FIG. 2, the output nodes of the pixels are the sources of the selecting transistors 207. Alternatively, the output nodes of the pixels can be sources of the amplifying transistors 205. A plurality of vertical output lines 208 are provided respectively corresponding to a plurality of pixel columns. Thus, signals output from a plurality of pixels 201 included in a single pixel row can be read to a plurality of vertical output lines 208 in parallel.

A vertical shift register 301 supplies drive pulses to the control lines 210, 211, and 212. Respective conduction states of the transferring transistor 203, the resetting transistor 206, and the selecting transistor 207 are controlled according to drive pulses supplied by the vertical shift register 301.

A column circuit unit 302 includes a correlated double sampling (hereinafter referred to as CDS) circuit for removing a fixed pattern noise of the pixels, and a column amplifying circuit for amplifying signals output from the pixels. The column amplifying circuit is an amplifying circuit configured to include, e.g., an operational amplifier and a feedback capacitor. The column amplifying circuit can be, e.g., a variable-gain amplifying circuit in which a plurality of sets of the feedback capacitor and a switch connected in series to the feedback capacitor are arranged on a feedback path from an output terminal of the operational amplifier to an input terminal thereof. In addition, the column circuit unit 302 can include a column ADC circuit for converting, into a digital signal, an analog signal corresponding to each column. It is necessary to provide the column circuit unit 302 only when need arises. A part or the entirety of the column circuit unit 302 can be omitted.

A signal holding unit 303 holds signals output from the pixels. The signal holding unit 303 can be configured to hold both of a noise signal and an optical signal onto which the noise signal is superimposed. The noise signal includes noise due to an offset of the column amplifying circuit of the column circuit unit 302. The optical signal is a signal based on an amount of signal charge generated by the photoelectric conversion unit 202. The signal holding unit 303 can be configured to hold only optical signals. If the column circuit unit 302 includes a column ADC circuit, the signal holding portion 303 can be omitted.

According to drive signals supplied by a horizontal shift register 304, signals held by the signal holding unit 303 are sequentially output, corresponding to each column, to horizontal output lines 305a and 305b. The signals output to the horizontal output lines 305a and 305b are subjected to difference processing by a difference amplifying unit 306. FIG. 3 illustrates the configuration employing two horizontal output lines. However, if the signal holding unit is configured to hold only optical signals, a single horizontal output line suffices.

The vertical shift register 301, the column circuit unit 302, the signal holding unit 303, the horizontal shift register 304, and the difference amplifying unit 306 can be included in the signal processing circuit. At least a part or the entirety of the above signal processing circuit is provided in the peripheral circuit region 105 according to the present exemplary embodiment.

FIG. 4 is a schematic diagram illustrating a cross-sectional structure including the first semiconductor substrate, the second semiconductor substrate, and an electrical connection portion between both of the semiconductor substrates. The first semiconductor substrate 401 includes a first pixel region 403. The second semiconductor substrate 402 includes a second pixel region 404 and a peripheral circuit region 405 provided with the signal processing circuit.

In the present specification, the term "semiconductor substrate" means a layer of a semiconductor material in which a photoelectric conversion unit and elements such as transistors are formed. In the present specification, a structure including semiconductor substrates and members made of materials other than semiconductor materials, such as insulating layers and wiring layers, is referred to simply as a substrate. If the substrate is a silicon-on-insulator (SOI) substrate configured by stacking two layers of semiconductor materials across an insulating layer provided therebetween, either of the two layers of semiconductor materials can be a semiconductor substrate. Alternatively, each semiconductor substrate can be a semiconductor layer formed by an epitaxial growth method. If a specific region is referred to in the following specification, the specific region is distinguished from semiconductor substrates, in the following description, by using the term "semiconductor region".

In FIG. 4, an upper principal surface of the first semiconductor substrate 401 is a first principal surface (hereinafter referred to also as a front-side surface) thereof. Wiring electrically connected to a gate electrode of the transferring transistor, and to the FD is provided on the first principal surface (i.e., the front-side surface) of the first semiconductor substrate 401. A lower principal surface of the first semiconductor substrate 401 is a second principal surface (hereinafter referred to also as a back-side surface) thereof. Arrow L indicates a direction in which light impinges upon the structure. Light is incident upon the photoelectric conversion portion from the side of the second principal surface (i.e., the back-side surface) of the first semiconductor substrate 401. A surface (i.e., a lower principal surface illustrated in FIG. 4) of the second semiconductor substrate 402, on which elements are provided, is a front-side surface thereof.

Sometimes, a principal surface or a front-side surface of a semiconductor substrate is actually an interface between the semiconductor and an insulating film stacked thereon. More specifically, in the present specification, the term "a front-side surface" or "a principal surface" of a semiconductor substrate is not limited to an interface between a semiconductor substrate and the air or to an interface between a semiconductor substrate and vacuum.

In the present exemplary embodiment, the first semiconductor substrate 401 and the second semiconductor substrate 402 are arranged such that the first principal surface (front-side surface) of the first semiconductor substrate 401 is directed to the second semiconductor substrate 402, and that the front-side surface of the second semiconductor substrate is directed to the first semiconductor substrate 401. An electrically-conductive pattern including a connection portion which will be described below is arranged between the first semiconductor substrate 401 and the second semiconductor substrate 402. Thus, the first semiconductor substrate 401 and the second semiconductor substrate 402 are arranged to face each other across the electrically-conductive pattern interposed therebetween.

In the first pixel region 403, the photoelectric conversion portion, the FD, and the transferring transistor are arranged like a matrix in units of pixels. That "a transistor is arranged on a semiconductor substrate" means that if the transistor is a metal-oxide semiconductor (MOS) transistor, a semiconductor region configuring a source, and another semiconductor region configuring a drain are arranged on a semiconductor substrate, and a gate electrode is arranged thereon across an insulating film. The same holds true for a case where a transistor is arranged on a semiconductor region included in a semiconductor substrate.

The photoelectric conversion unit is configured to include an N-type semiconductor region 406, a P-type semiconductor region 407, and another P-type semiconductor region 408. The N-type semiconductor region 406 is a region in which signal charges are collected. The P-type semiconductor region 407 is arranged in the vicinity of the first principal surface (front-side surface) of the first semiconductor substrate 401 in order to reduce possibility of mixing of dark current generated on the interface between the first semiconductor substrate 401 and the insulating film arranged on the first principal surface (front-side surface) side thereof into the signal charges collected in the N-type semiconductor region 406. The P-type semiconductor region 408 is arranged closer to the second principal surface (back-side surface) of the first semiconductor substrate 401 than the N-type semiconductor region 406. The P-type semiconductor region 408 can be arranged in the vicinity of the first principal surface (front-side surface) of the first semiconductor substrate 401 in order to reduce possibility of mixing of dark current generated on the interface between the first semiconductor substrate 401 and the insulating film arranged on the second principal surface (back-side surface) side thereof into the signal charges collected in the N-type semiconductor region 406. Each N-type semiconductor region 406 and each of the associated P-type semiconductor regions 407 and 408 configure a PN-junction. Thus, embedded type photodiodes are configured.

A transferring gate electrode 409 is arranged across an insulating film (not shown) on the first principal surface (front-side surface) side in a channel region adjoining a photoelectric conversion unit of the first semiconductor substrate 401. A channel is formed in the channel region according to a voltage applied to a transferring gate electrode 409. The channel region may be made different from the first semiconductor substrate 401 in impurity concentration by implanting channel-impurities, if necessary.

An N-type semiconductor region 410 is arranged adjacent to the channel region. The N-type semiconductor region 410 configures an FD. The N-type semiconductor region 410 is higher in impurity concentration than the N-type semiconductor region 406. A transferring transistor is configured using the N-type semiconductor region 406, the N-type semiconductor region 410, and the transferring gate electrode 409 as a source, a drain, and a gate, respectively.

The N-type semiconductor region 410 is connected to wiring across a first plug 411. The first plug 411 is formed by an electrically-conductive material such as tungsten. The first plug 411, and the wiring connected to the first plug 411 are arranged on the first principal surface (front-side surface) side of the first semiconductor substrate 401.

The amplifying transistor, the resetting transistor, and the selecting transistor are arranged like a matrix in the second pixel region 404 in units of pixels. FIG. 4 illustrates a cross-section of the amplifying transistor 412 as an example. N-type semiconductor regions serving as a source and a drain of an amplifying transistor 412 are arranged on the second semiconductor substrate 402. Preferably, the impurity concentrations of the N-type semiconductor regions respectively serving as the source and the drain of the amplifying transistor 412 are higher than that of the N-type semiconductor region 410 configuring the FD. An insulating film (not shown) is arranged on the front-side surface of the second semiconductor substrate 402. A gate electrode 413 of the amplifying transistor 412 is arranged on the front-side surface of the second semiconductor substrate 402 across an insulating film (not shown). The gate electrode 413 of the amplifying transistor 412 is connected to the wiring across a second plug 414. The second plug 414 is formed by an electrically-conductive material such as tungsten. The second plug 414 connected to a gate of the amplifying transistor 412, and the wiring connected to the second plug 414 are arranged on a surface (front-side surface) side of the second semiconductor substrate 402 on which the elements are arranged.

The gate electrode 413 of the transistor arranged in the second pixel region 404 can be configured such that a polysilicon layer and a metal silicide layer are stacked. Alternatively, a metal silicide layer can be arranged on a front-side surface of the source regions and the drain regions of the transistors provided in the second pixel region 404.

The N-type semiconductor region 410 configuring the FD, and the gate electrode 413 of the amplifying transistor 412 are electrically connected across a connection portion 415 to each other. The connection portion 415 is an electrically conductive pattern formed by an electrically conductive material, e.g., copper. Preferably, a connection portion connecting the FD and the gate electrode of the amplifying transistor is arranged in a region obtained by projecting the first pixel region 403 in the direction of the second semiconductor substrate 402. Preferably, as illustrated in FIG. 4, a plurality of connection portions are arranged corresponding to the FDs of a plurality of pixels.

Elements configuring the signal processing circuit are arranged in the peripheral circuit region 405 of the second semiconductor substrate 402. FIG. 4 illustrates an element 416 configuring the vertical shift register as an example. The vertical shift register supplies drive pulses to wiring 418 arranged on the first principal surface (front-side surface) side of the first semiconductor substrate 401 via a connection portion 417. The wiring 418 is connected to, e.g., a gate of the transferring transistor. The connection portion 417 is arranged in a region obtained by projecting the peripheral circuit region 405 in the direction of the first semiconductor substrate 401. However, the connection portion 417 can be arranged at another location. A single connection portion 417 can be arranged corresponding to a plurality of pixels included in a single pixel row. Alternatively, a single connection portion 417 can be arranged corresponding to each pixel.

In the first pixel region 403, element isolation portions for electrically isolating pixels from one another, which are arranged like a matrix, are provided in the first pixel region 403. The element isolation portions isolate the photoelectric conversion portions of adjacent pixels from one another or isolate the photoelectric conversion portion of each pixel from the FD of each pixel adjacent thereto. Alternatively, the element isolation portions can be configured to isolate the FDs of adjacent pixels from one another.

The present exemplary embodiment uses PN isolation in the element isolation portions of the first pixel region 403. In a cross-section illustrated in FIG. 4, a P-type semiconductor region 419 is provided between the photoelectric conversion unit and the N-type semiconductor region 410 configuring the FD of the adjacent pixel. The P-type semiconductor region 419 and each of the N-type semiconductor region 406 configuring the photoelectric conversion unit, and the N-type semiconductor region 410 configuring the FD configure a PN-junction. The P-type semiconductor region 419 serves as a potential barrier. Accordingly, element isolation can be performed by the P-type semiconductor region 419.

Preferably, a voltage of the P-type semiconductor region 419 is fixed at a GND voltage, and a reverse bias voltage is applied to the PN junction. The P-type semiconductor regions 407, 408, and 419 can be set at the same voltage by connecting each of the semiconductor regions 407 and 408 to the semiconductor region 419. A plurality of contact plugs can be provided in the first pixel regions 403 as means for supplying a predetermined voltage to each of the P-type semiconductor regions. Alternatively, a single contact plug can be provided in a region other than the first pixel region 403. In order to improve the electrical connection between the contact plug and each of the P-type semiconductor regions 407, 408, and 419, the contact plug can be connected to a P-type semiconductor region which is provided in the P-type semiconductor regions 407, 408, and 419 and is higher in impurity concentration than these regions.

Any element isolation structure can be used in the element isolation portions 420 provided in regions other than the first pixel region 403, i.e., in the second pixel region 404 and the peripheral circuit region 405. Preferably, the LOCOS isolation and the STI isolation are used in the element isolation portions 420. Alternatively, PN isolation and mesa-type insulator isolation can be used in the element isolation portion 420. Preferably, the element isolation portion of the second pixel region and that of the peripheral circuit region have the same element isolation structure. However, the element isolation portion of the second pixel region and that of the peripheral circuit region can differ from each other in element isolation structure.

Figure 5A:
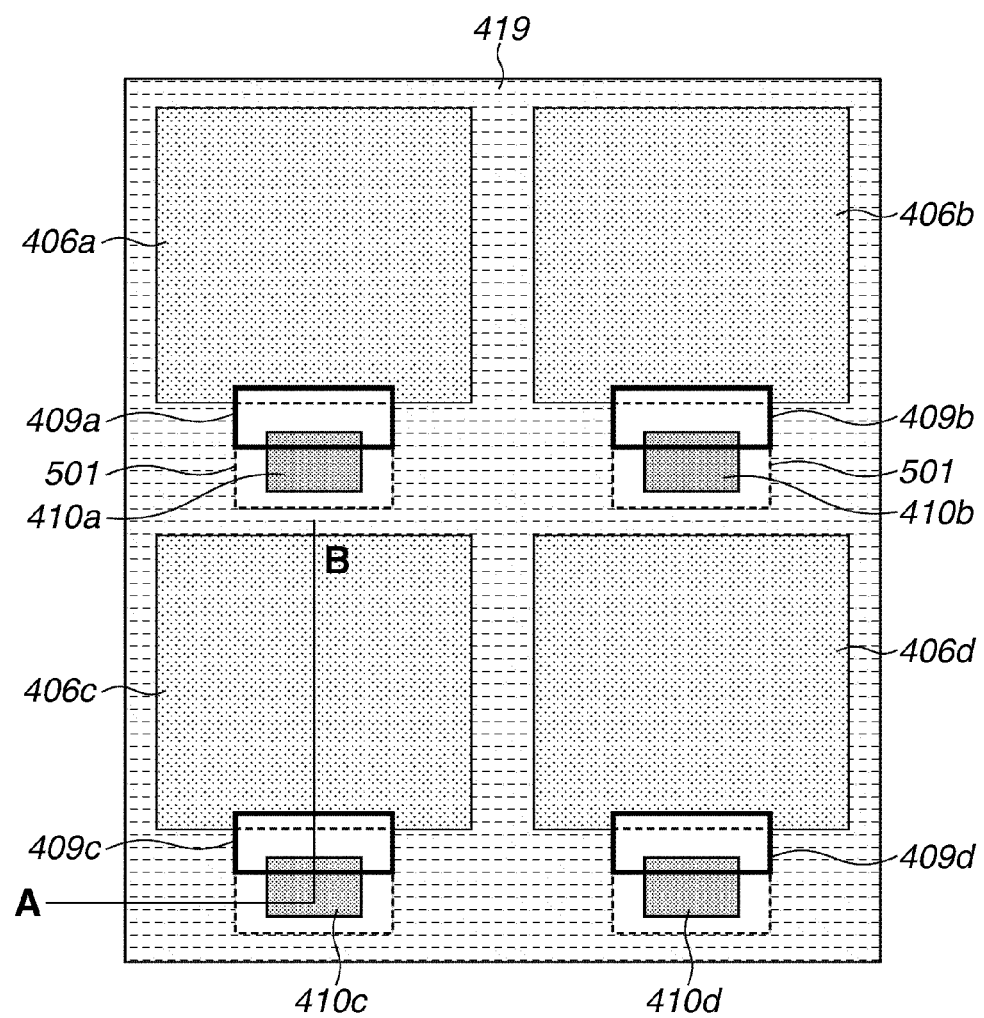
FIG. 5A is a schematic diagram illustrating a planar structure of the pixel unit of the first exemplary embodiment of the solid-state imaging device according to the present invention.
Figure 5B:
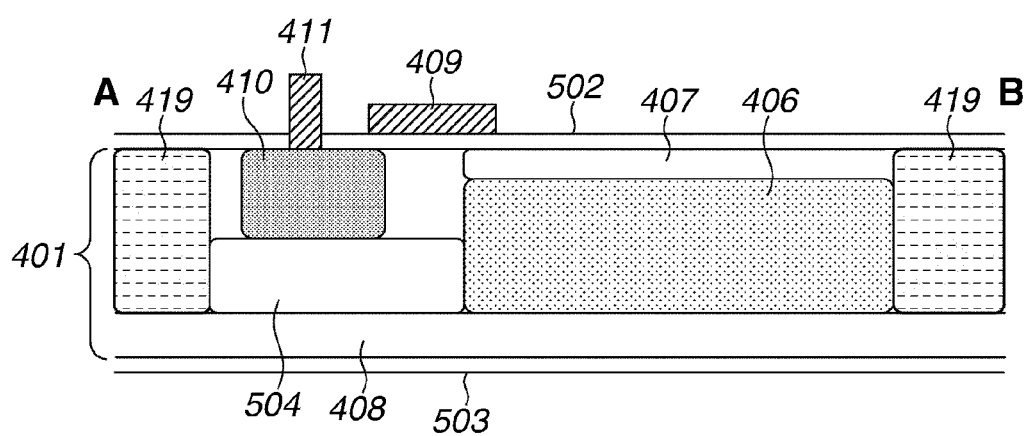
FIG. 5B is a schematic diagram illustrating a planar structure of the pixel unit of the first exemplary embodiment of the solid-state imaging device according to the present invention.

FIGS. 5A and 5B are schematic diagrams illustrating a planar structure and a cross-sectional structure of each pixel of the first pixel region in the present exemplary embodiment. FIG. 5A is a schematic diagram illustrating a planar structure of each pixel. FIG. 5B is a schematic diagram illustrating a cross-sectional structure taken along line A-B illustrated in FIG. 5A. Each component having the same function as that of an associated component illustrated in FIG. 4 is designated with the same reference numeral as that designating the associated component illustrated in FIG. 4. Description of such components is omitted. Associated parts of different pixels are distinguished from one another by adding different suffixes to ends of reference numerals.

FIG. 5A illustrates the N-type semiconductor region 406 configuring the photoelectric conversion unit, the N-type semiconductor region 410 configuring the FD, the P-type semiconductor region 419 configuring the element isolation portion, and the gate electrode 409 of the transferring transistor. In the present exemplary embodiment, one transferring transistor and one FD are provided corresponding to one photoelectric conversion unit. In the present exemplary embodiment, a plurality of transferring transistors and a plurality of FDs are arranged like a matrix in units of pixels. More specifically, the first pixel region is divided into domains and in each domain, each of a plurality of pixels is provided. Thus, in each of the divided domains, a photoelectric conversion unit, a transistor and an FD included in an associated single pixel are provided.

The P-type semiconductor region 419 is provided such that a plurality of pixels provided in the first pixel region can electrically be isolated from one another. More specifically, the P-type semiconductor region 419 is provided between an N-type semiconductor region 406a of each pixel and an N-type semiconductor region 406b of each pixel adjacent thereto, and between an N-type semiconductor region 410a of each pixel and an N-type semiconductor region 406c of each pixel adjacent thereto. In addition, the P-type semiconductor region 419 is provided between the N-type semiconductor region 410a of each pixel and an N-type semiconductor region 410b of each pixel adjacent thereto.

Each region 501 surrounded by dashed lines illustrated in FIG. 5A indicates an area in which P-type semiconductor regions 407 are not provided. The P-type semiconductor regions 407 are provided in the entire area other than the regions 501. More specifically, the P-type semiconductor region 407 extends over a plurality of pixels. The P-type semiconductor region 407 is higher than the P-type semiconductor region 419 in impurity concentration.

As illustrated in FIG. 5A, in the present exemplary embodiment, the N-type semiconductor regions 410 and the P-type semiconductor region 407 are provided at a predetermined distance in a direction along a plane of a plan diagram. An end part along a channel direction of the transferring gate 409 of each transferring transistor coincides with that of the P-type semiconductor region 407. According to such an arrangement, the P-type semiconductor 407 defines a channel width of the transferring transistor even when an end part of the P-type semiconductor region 407 is located at a lower part of the transferring gate electrode 409.

The arrangement of the P-type semiconductor region 407 is not limited to that. As long as the P-type semiconductor region 407 is provided on at least a part of the N-type semiconductor region 406, the arrangement can be employed.

In order to miniaturize the pixels, it is desirable that the center of gravity of the N-type semiconductor region 410a configuring the FD of each pixel and that of gravity of the N-type semiconductor region 410b configuring the FD of a pixel adjacent thereto are spaced at a distance equal to or less than 3 micrometers.

FIG. 5B further illustrates the P-type semiconductor region 408, the first plug 411, an insulating film provided on the first principal surface (front-side surface) side of the first semiconductor substrate 401, and an insulating film 503 provided on the second principal surface (back-side surface) side thereof. Although FIG. 5B illustrates a configuration in which the P-type semiconductor region 407 is provided only on the first principal surface side of the N-type semiconductor region 406, the P-type semiconductor region 407 can be provided on an area in which the element isolation region 419 is provided.

A P-type semiconductor region 504 can be provided under the N-type semiconductor region 410 configuring the FD. It is desirable that the P-type semiconductor region 504 is arranged to extend in the direction of the plane of the plan diagram over the entire surface of the region 501 surrounded by the dashed lines. More specifically, it is desirable that when the P-type semiconductor region 409 and the P-type semiconductor region 504 are projected in the direction of the insulating film 502, an area onto which the P-type semiconductor region 409 is projected does not overlap with an area onto which the P-type semiconductor region 504 is projected.

An amount of electric-charges of the N-type semiconductor regions 406, which are mixed into those of the N-type semiconductor regions 410, can be reduced by the P-type semiconductor region 504. During an exposure time period, a negative voltage is applied to the transferring gate electrode 407. Thus, a potential barrier for electrons in the semiconductor region provided under the transferring gate electrode 407 is increased. However, an electric field from the transferring gate electrode 407 does not sufficiently reach the inside of the semiconductor substrate. Accordingly, the potential barrier between the N-type semiconductor regions 406 and 410 is low. It is favorable that the P-type semiconductor region 504 is provided in a region which an electric field from the transferring gate electrode 407 does not sufficiently reach, in the semiconductor substrate.

As illustrated in FIG. 5B, a depth of the interface between the first semiconductor substrate 401 and the insulating film 502 in the element isolation portion with respect to the interface therebetween in the photoelectric conversion unit is 0. If the SIT isolation or the LOCOS isolation is applied to the second pixel region or the peripheral circuit region, the depth of the interface between the first semiconductor substrate 401 and the insulating film 502 in the element isolation portion is shallower than that of the interface between the first semiconductor substrate 401 and a insulating film in such an element isolation portion due to the SIT isolation or the LOCOS isolation.

The present exemplary embodiment doesn't use an element isolation structure in which an insulating film is provided in the semiconductor substrate, in each element isolation portion due to the LOCOS isolation or the STI isolation in the first pixel region. The structure in which an insulating film is provided in the semiconductor substrate includes a structure in which the insulating film stacked in the semiconductor substrate has a part protruding in a direction of the semiconductor substrate. However, the element isolation portion of the first pixel region doesn't include an element isolation structure in which the insulating film is provided in the semiconductor substrate. Thus, the interface between the first semiconductor substrate 401 and the insulating film 502 provided in the first principal surface (front-side surface) side of the first semiconductor substrate 401 extends flat over the first pixel region. It is not necessary that the interface between the semiconductor substrate and the insulating film (hereinafter sometimes referred to as a semiconductor-substrate/insulating-film interface) is completely flat. For example, a semiconductor-substrate/insulating-film interface can have roughness due to a manufacturing process.

The element isolation structure due to the above PN isolation is an element isolation structure due to the semiconductor region serving as a potential barrier for signal charges. Thus, the semiconductor-substrate/insulating-film interface extends substantially flat. A structure in which the insulating film is locally thick due to the LOCOS isolation falls under the category of the structure in which the insulating film is provided in the semiconductor substrate. A structure in which the insulating film is embedded into a groove formed in the semiconductor substrate for the STI isolation, falls under the category of the structure in which the insulating film is provided in the semiconductor substrate. Accordingly, if the LOCOS isolation or the STI isolation is used in the element isolation portion, the interface between the semiconductor substrate and the insulating film is not flat.

If the insulating film is provided in the semiconductor substrate, stress is generated in the semiconductor substrate. Thus, interface defect increases, as compared with a case where the interface between the semiconductor substrate and the insulating film is substantially flat. When the interface defect increases, dark current increases. Accordingly, if the interface between the semiconductor substrate and the insulating film is substantially flat, the possibility of occurrence of dark current can be reduced, as compared with the case where the interface therebetween is not flat.

According to the present exemplary embodiment, a (1 0 0)-surface of the semiconductor substrate can be set to be the first principal surface (front-side surface). Generally, when an insulating film is provided on the (1 0 0)-surface of the semiconductor substrate, there is an advantage that interface defect is reduced, as compared with the case where the insulating film is provided on another surface. If the interface therebetween is not flat in the configuration in which the (1 0 0)-surface of the semiconductor substrate is set to be the first principal surface, the semiconductor-substrate/insulating-film interface is provided on the surface other than the (1 0 0)-surface. Accordingly, the interface defect increases and the dark current increases.

As described above, in the present exemplary embodiment, the photoelectric conversion unit, the transferring transistor, and the FD are provided in the first pixel region, while the amplifying transistor, and the resetting transistor are provided in another pixel region, i.e., the second pixel region. The element isolation portion of the first pixel region doesn't include an element isolation structure in which an insulating film is provided in the first semiconductor substrate. Thus, the interface between the semiconductor region of the first semiconductor substrate and the insulating film stacked in the front-side surface of the first semiconductor substrate is substantially flat over the first pixel region.

With such a configuration, mixing of noise due to dark current generated on the interface between the semiconductor substrate and the insulating film for isolating the amplifying transistor and the resetting transistor, into the photoelectric conversion unit can be reduced. In addition, with such a configuration, a wide element isolation portion is not needed in the first pixel region. Thus, a rate of the photoelectric conversion unit to a planar size of each pixel can be increased. Accordingly, enhancement of sensitivity of each pixel and miniaturization thereof can be achieved.

According to the configuration of the present exemplary embodiment, noise due to color mixture among pixels can be reduced. Light rays which are incident from the second principal surface (back-side surface) of the first semiconductor substrate and unabsorbed by the substrate, reach the interface between the semiconductor region of the first semiconductor substrate and the insulating film stacked on the first principal surface (front-side surface) side of the semiconductor region. A part of light reaching the interface is deflected or reflected by the interface between the semiconductor substrate and the insulating film. If the region provided with the photoelectric conversion unit includes the element isolation structure in which the insulating film is provided in the first semiconductor substrate, such light is irregularly reflected because of a complex shape of the insulating film. A relatively large amount of light goes into an adjacent pixel. Such light causes mixed color. In the present exemplary embodiment, the interface between the semiconductor region and the insulating film in the first pixel region is substantially flat. Therefore, irregular reflection of incident light on the first principal surface (front-side surface) of the first semiconductor substrate can be reduced. Consequently, occurrence of color mixture among adjacent pixels can be reduced.

Figure 12A:
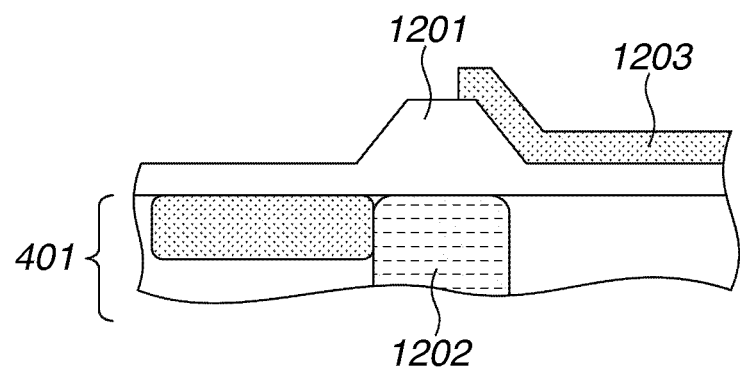
FIG. 12A is a schematic diagram illustrating a cross-sectional structure of a modification of the first exemplary embodiment of the solid-state imaging device according to the present invention.

In the first exemplary embodiment, a configuration using the PN isolation in the element isolation portion of the first pixel region is described as an example. Hereinafter, a modification of the first exemplary embodiment is described. The mesa-type insulator isolation can be used in the element isolation portion of the first pixel region. FIG. 12 is a schematic diagram illustrating a cross-sectional structure of a mesa-type insulator isolation portion.

An insulating film provided on the first principal surface (front-side surface) of the first semiconductor substrate 401 has a protrusion portion 1201 provided on a side opposite to the first semiconductor substrate. The protrusion portion 1201 can be configured by either a part of the insulating film provided on the first principal surface of the first semiconductor substrate 401 or a member differing from the insulating film. Alternatively, the protrusion portion 1201 can be configured by stacking an insulating film on another insulating film provided on the first principal surface of the first semiconductor substrate 401. A P-type semiconductor region 1202 is provided in a region in which the protrusion portion 1201 is provided on the first principal surface (front-sided surface) side of the first semiconductor substrate 401. A transferring gate 1202 of the transferring transistor can be provided on the protrusion portion 1201.

Thus, even when the mesa-type insulator isolation is used, a thick insulating film is provided, similarly to the case of using the LOCOS isolation. However, even in the case of using the mesa-type insulator insulation, the interface between the first semiconductor substrate 401 and the insulating film provided on the first principal surface (front-side surface) side of the first semiconductor substrate 401 extends substantially flat over the first pixel region. Accordingly, stress generated in the semiconductor substrate is small, differently from the case of using the LOCOS isolation. Thus, advantages similar to those of the first exemplary embodiment can be obtained.

In order to improve the function of element isolation, the element isolation structure in which an insulating film is provided in the semiconductor substrate can be used in the element isolation portion of the first pixel region. However, it is desirable that an amount of protrusion of the insulating film into the semiconductor substrate is small, as compared with the element isolation portion provided in the second pixel region or the peripheral circuit region.

Figure 12B:
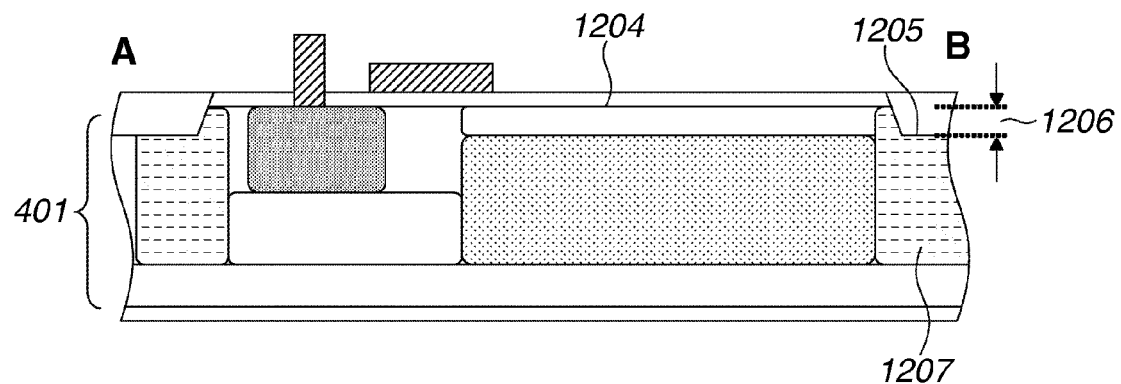
FIG. 12B is a schematic diagram illustrating a cross-sectional structure of a modification of the first exemplary embodiment of the solid-state imaging device according to the present invention.
Figure 12C:
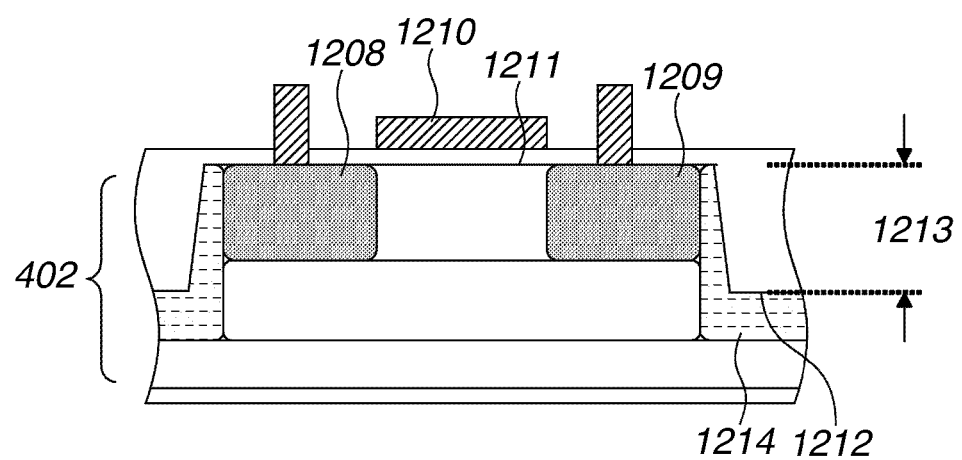
FIG. 12C is a schematic diagram illustrating a cross-sectional structure of a modification of the first exemplary embodiment of the solid-state imaging device according to the present invention.

FIG. 12B is a schematic diagram illustrating a cross-sectional structure of each pixel in the first pixel region according to a modification of the first exemplary embodiment. However, description of a part thereof, which is similar to that illustrated in FIG. 5B, is omitted. FIG. 12C is a schematic diagram illustrating a cross-sectional structure of the second pixel region or the peripheral circuit region.

As illustrated in FIG. 12B, an insulating film provided on the first principal surface (front-side surface) of the first semiconductor substrate 401 protrudes into the first semiconductor substrate 401 in the element isolation portion. More specifically, an interface 1204 between the first semiconductor substrate 401 and an insulating film in the element isolation portion is provided at a first depth 1206 with respect to an interface 1204 between the first semiconductor substrate 401 and an insulating film in the photoelectric conversion unit. A P-type semiconductor region 1207 is provided in the element isolation portion of the first pixel region. A practical example of such a configuration is a structure due to electro-deionization (EDI) isolation. The structure due to the EDI isolation is configured to include a P-type semiconductor region and an insulating film deposited on an upper part of the P-type semiconductor region.

A depth direction is defined as a direction perpendicular to the first principal surface (front-side surface) in the photoelectric conversion unit of the first semiconductor substrate. That the "depth is shallow" means that a distance from a reference surface is small.

FIG. 12C is a schematic diagram illustrating a cross-sectional structure of a transistor provided in the second pixel region or the peripheral circuit region. An example of a configuration using the STI isolation for the element isolation of the second pixel region or the peripheral circuit region is described hereinafter. However, the configuration can use the LOCOS isolation.

N-type semiconductor regions 1208 and 1209 respectively configuring a source or a drain of a transistor are provided on the front-side surface of the second semiconductor substrate 402. A gate electrode 1201 is provided on the front-side surface side of the second semiconductor substrate 402 across an insulating film.

A P-type semiconductor region 1214 is provided in the element isolation portion of the second semiconductor substrate 402. A groove is provided in the element isolation portion of the second semiconductor substrate 402. An insulating film is embedded in the groove. Thus, the insulating film provided on the front-side surface of the second semiconductor substrate 402 protrudes into the second semiconductor substrate 402 in the element isolation portion. More specifically, an interface 1212 between the second semiconductor substrate 402 and the insulating film in the element isolation portion is provided at a second depth 1213 with respect to an interface 1211 between the second semiconductor substrate 402 and the insulating film in a region in which a transistor is provided. The region serving as a reference, in which a transistor is provided, is, e.g., a semiconductor region configuring the source or drain of the transistor.

The present exemplary modification has a feature that the first depth 1206 is shallow, as compared with the second depth 1213. The present exemplary modification can be applied to a case where the first depth 1206 is zero, in other words where the interface between the first semiconductor substrate 401 and the insulating film is substantially flat.

If the element isolation portion of the first pixel region includes the insulating film provided in the semiconductor substrate, increase of dark current is small in case where an amount of protrusion of the insulating film into the semiconductor substrate is small, as compared with the element isolation portions of other regions. Accordingly, advantages substantially the same as those of the first exemplary embodiment can be obtained.

In the case of the present modification, the second pixel region included in the second semiconductor substrate, or the element isolation portion provided in the peripheral circuit region is employed as a target of comparison. As described below, a configuration including a peripheral circuit region provided in the semiconductor substrate can be employed. In addition, an element isolation portion provided in the peripheral circuit region included in the first semiconductor substrate can be employed as a target of comparison.

Figure 13A:
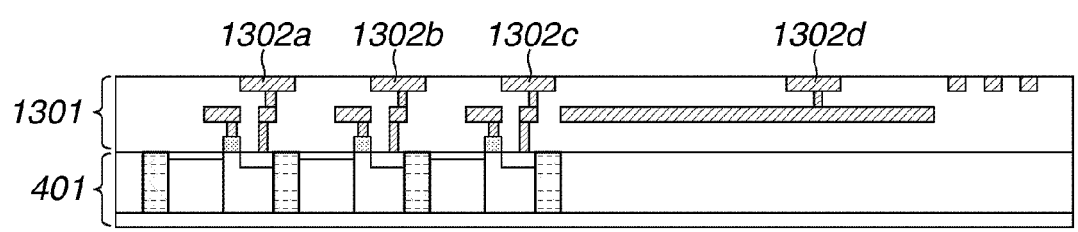
FIG. 13A is a cross-sectional diagram illustrating a manufacturing method according to the first exemplary embodiment of the solid-state imaging device according to the present invention.
Figure 13B:
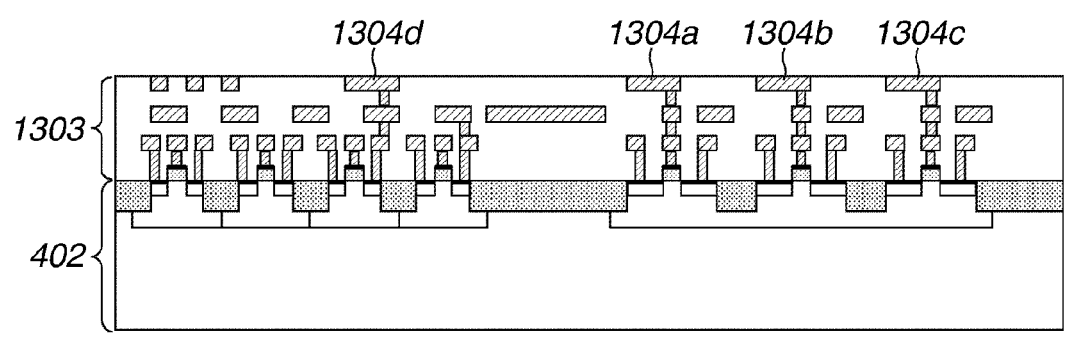
FIG. 13B is a cross-sectional diagram illustrating a manufacturing method according to the first exemplary embodiment of the solid-state imaging device according to the present invention.
Figure 13C:
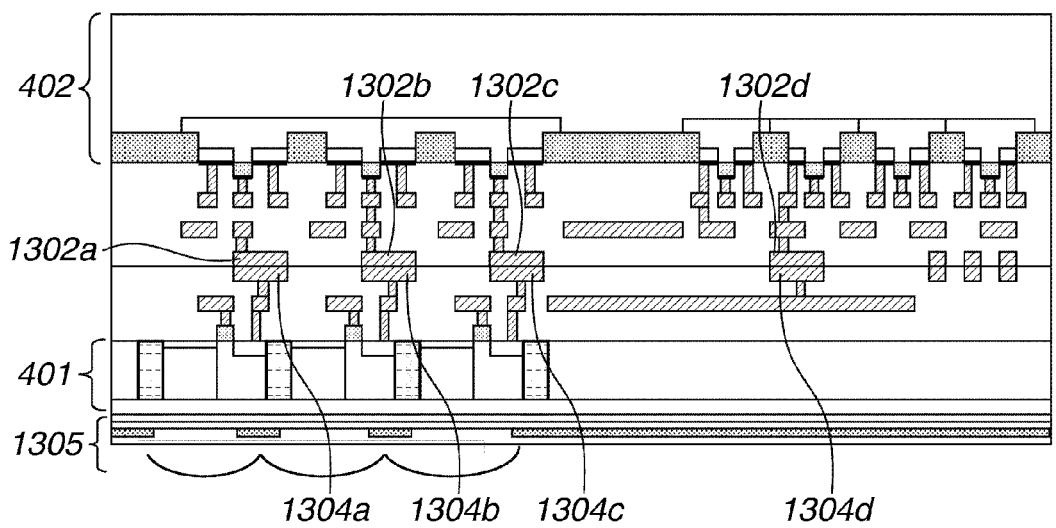
FIG. 13C is a cross-sectional diagram illustrating a manufacturing method according to the first exemplary embodiment of the solid-state imaging device according to the present invention.

Next, a suitable manufacturing method for manufacturing the solid-state imaging device according to the first exemplary embodiment is briefly described hereinafter with reference to the drawings. FIG. 13A through 13C is a schematic diagram illustrating a cross-sectional structure in a manufacturing process according to the first exemplary embodiment.

FIG. 13A illustrates a step of preparing the first semiconductor substrate 401. The first semiconductor substrate 401 is, e.g., a silicon substrate. An element isolation portion is formed in the first pixel region of the first semiconductor substrate 401. Then, each semiconductor region and a gate electrode are formed in and on the first semiconductor substrate 401. Next, a plurality of interlayer insulating films and second multilayer wiring 1301, in which a plurality of wiring layers are stacked, are formed on the first principal surface (front-side surface) side of the first semiconductor substrate 401. A plurality of wiring layers is connected by contact plugs to one another. A connection portion 1302 to be connected to the first semiconductor substrate 401 is provided on the uppermost layer of the first multilayer wiring layer 1301.

FIG. 13B illustrates a step of preparing the second semiconductor substrate 402. The second semiconductor substrate 402 is, e.g., a silicon substrate. A second pixel region and an element isolation portion are formed in the second semiconductor substrate and the peripheral circuit region. Then, each semiconductor region and a gate electrode are formed in and on the second semiconductor substrate 402. Next, a plurality of interlayer insulating films and second multilayer wiring 1303, in which a plurality of wiring layers are stacked, are formed on the front-side surface side of the second semiconductor substrate 402. A plurality of wiring layers is connected by contact plugs to one another. A connection portion 1304 to be connected to the first semiconductor substrate 401 is provided on the uppermost layer of the second multilayer wiring layer 1303.

FIG. 13C illustrates a step of connecting the first semiconductor substrate 401 to the second semiconductor substrate 402. The connection portion 1302 illustrated in FIG. 13A, and the connection portion 1304 illustrated in FIG. 13B are connected to associated connection parts, respectively. As a suffix of the associated connection part, the same alphabetic character is added as that of the connection portion. For example, a connection portion 1302 illustrated in FIG. 13A is connected to a connection part 1304a illustrated in FIG. 13B.

As illustrated in FIG. 13C, the first semiconductor substrate 401 and the second semiconductor substrate 402 are provided such that the first principal surface (front-side surface) of the first semiconductor substrate 401 faces the second semiconductor substrate 402, and that the front-side surface of the second semiconductor substrate 402 faces the first semiconductor substrate 401.

After the process of connecting the first semiconductor substrate 401 to the second semiconductor substrate 402, an optical member 1305 is formed on the second principal surface (back-side surface) opposite to the first principal surface of the first semiconductor substrate 401, if necessary. The optical member 1305 can include a light shielding film, a color filter, and a microlens.

A silicon dioxide film, a silicon nitride film, a silicon oxynitride film, and a film stack of such films can be used as the insulating film according to the present exemplary embodiment. In the following description of a second exemplary embodiment or later, examples using a silicon dioxide film as the insulating film are described.

Hereinafter, a second embodiment of the solid-state imaging device to which the present invention is applied is described. In the present exemplary embodiment, the first semiconductor substrate 101 and the second semiconductor substrate 102 are arranged to face each other across wiring for connecting circuits provided on both of the semiconductor substrates 101 and 102, similarly to those of the first exemplary embodiment. A feature of the second exemplary embodiment is that a plurality of pixels share an FD. A detailed description of components of the present exemplary embodiment, which are similar to associated components of the first exemplary embodiment, is omitted.

Figure 6:
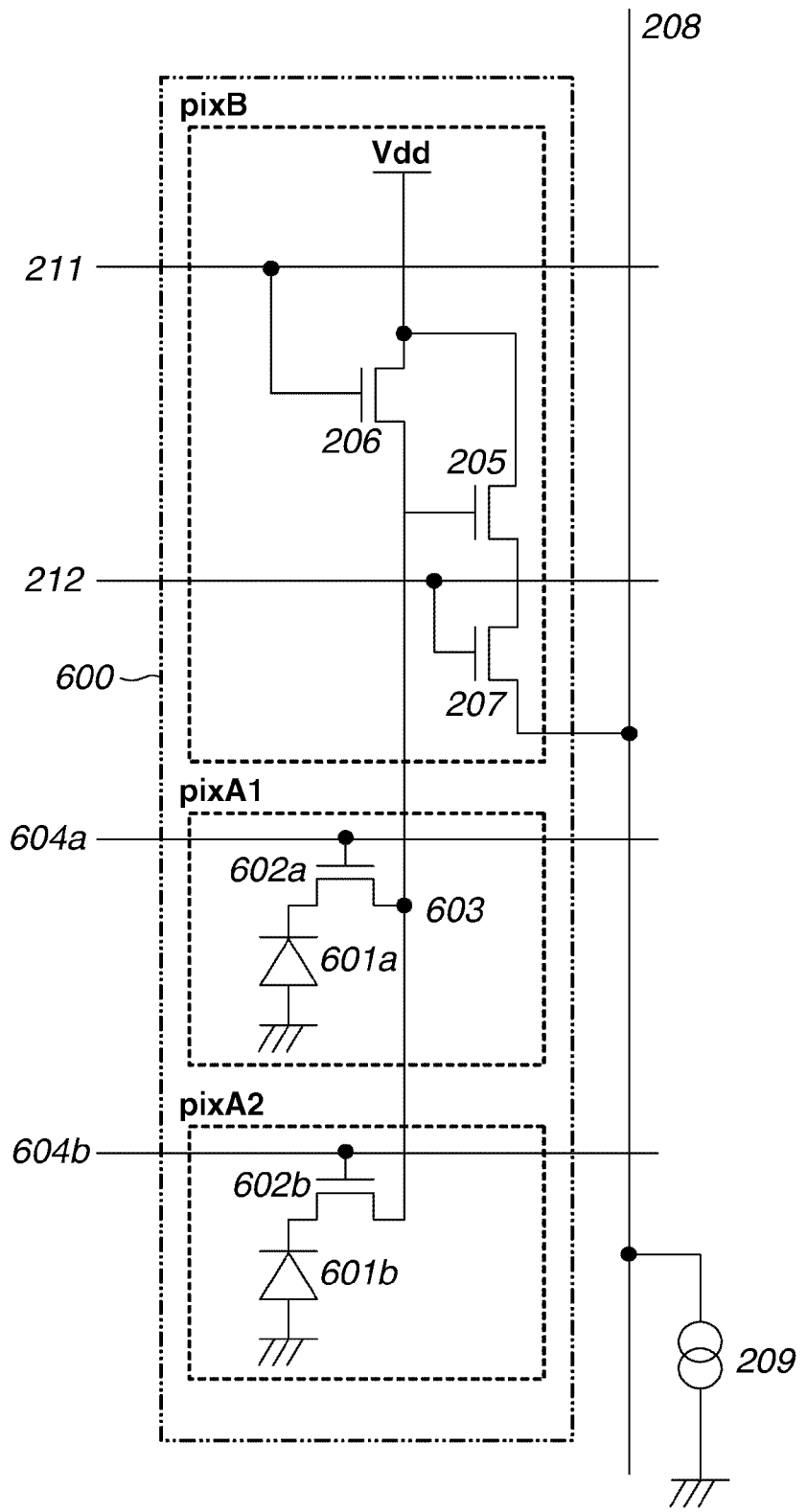
FIG. 6 is an equivalent circuit diagram illustrating a pixel unit of a second exemplary embodiment of a solid-state imaging device according to the present invention.

FIG. 6 is an equivalent circuit diagram illustrating an equivalent circuit of each pixel according to the present exemplary embodiment. Each component of the present exemplary embodiment, which has the same function as that of an associated component illustrated in FIG. 2, is designated with the same reference numeral as that denoting the associated component. Thus, a detailed description of such components is omitted. In the present exemplary embodiment, a first photoelectric conversion unit 601a, a second photoelectric conversion unit 601b, a first transferring transistor 602a, a second transferring transistor 602b, and an FD 603 are provided. The first photoelectric conversion unit 601a is connected to the FD 603 via the first transferring transistor 602a. The second photoelectric conversion unit 601b is connected to the FD 603 via the second transferring transistor 602b. More specifically, a pixel including the first photoelectric conversion unit 601a and another pixel including the second photoelectric conversion unit 601b share the FD 603. A control line 604a and another control line 604b are connected to a gate of the first transferring transistor 602a and that of the second transferring transistor 602b, respectively.

The first photoelectric conversion unit 601a, the second photoelectric conversion unit 601b, the first transferring transistor 602a, the second transferring transistor 602b, and the FD 603 are provided in the first pixel region 103 of the first semiconductor substrate 101 illustrated in FIG. 1A. The amplifying transistor 205, the resetting transistor 206, and the selecting transistor 207 are provided in the second pixel region 104 of the second semiconductor substrate 102 illustrated in FIG. 1A. The electrical connection portion between the first semiconductor substrate 101 and the second semiconductor substrate 102 is provided on the path between the FD 603 and the gate of the amplifying transistor 205.

FIG. 6 illustrates a single unit 600 including two pixels that share the FD 603. Actually, a plurality of units 600 are arranged like a matrix. A plurality of units 600 included in a single column is connected to the vertical output line 208.

In the present exemplary embodiment, the PN isolation is used in the element isolation portion of the first pixel region. Accordingly, the interface between the first semiconductor substrate 101 and the insulating film stacked on the first principal surface (front-side surface) side thereof extends substantially flat over the first pixel region.

Figure 7:
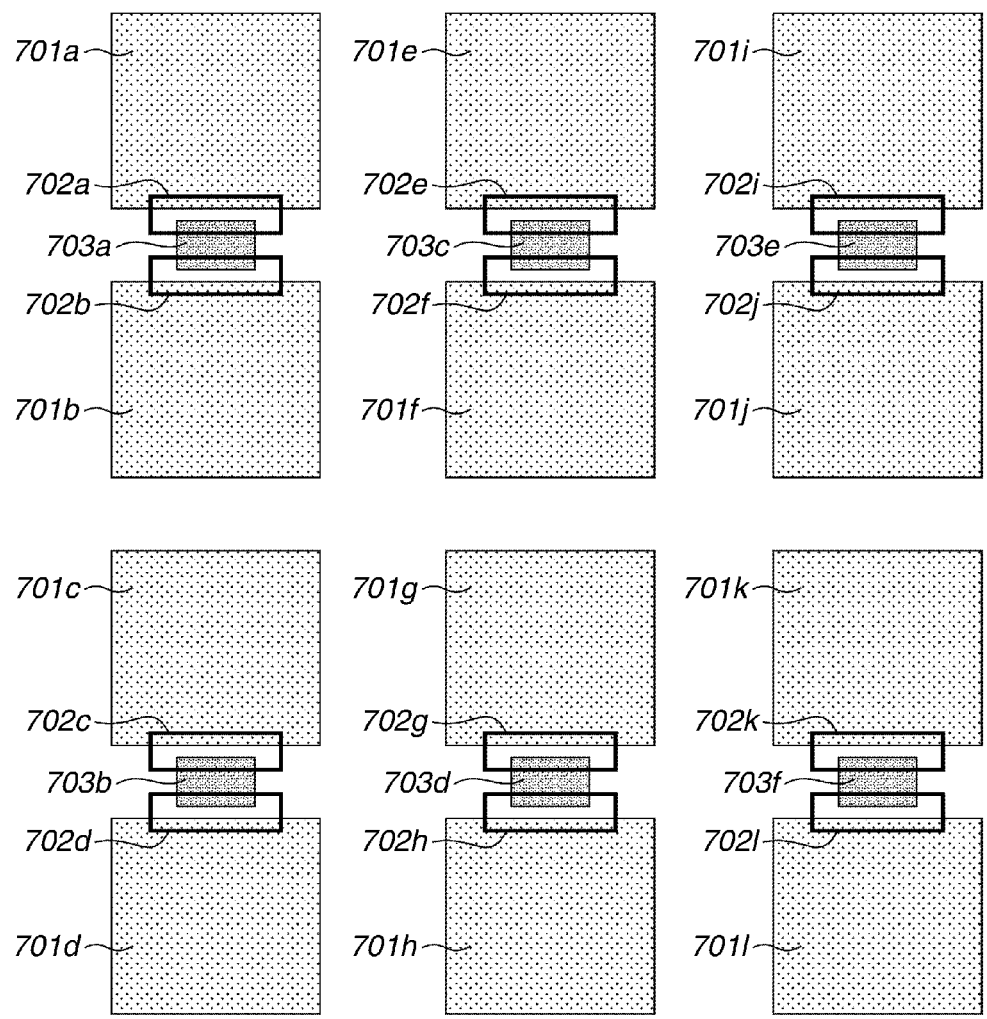
FIG. 7 is a schematic diagram illustrating a planar structure of the pixel unit of the second exemplary embodiment of the solid-state imaging device according to the present invention.

FIG. 7 is a schematic diagram illustrating a planar structure of each pixel in the first pixel region in the present exemplary embodiment. FIG. 7 illustrates an N-type semiconductor region 701 configuring the photoelectric conversion unit, a transferring gate electrode 702 of the transferring transistor, and an N-type semiconductor region 703 configuring the FD. Associated components of different pixels are distinguished from one another by adding different suffixes to ends of reference numerals.

A set of an N-type semiconductor region 701a and a transferring gate electrode 702a, and a set of an N-type semiconductor region 701b and a transferring gate electrode 702b are provided corresponding to an N-type semiconductor region 703a. Signal charges generated by the N-type semiconductor regions 701a and 701b are transferred by the transferring gate electrodes 702a and 702b to the N-type semiconductor region 703a serving as the FD. Thus, a plurality of pixels shares the FD. Even in the present exemplary embodiment, element isolation portions (not shown) for electrically isolating a plurality of pixels provided in the first pixel region from one another are provided.

The solid-state imaging device according to the present exemplary embodiment has the following advantage in addition to those of the first exemplary embodiment. According to the present exemplary embodiment, a plurality of the pixels shares the FD. With such a configuration, the number of elements configuring each pixel can be reduced. Thus, a rate of the photoelectric conversion unit to the planar size of pixels can be further increased. Accordingly, further enhancement of sensitivity of each pixel and further miniaturization thereof can be achieved.

Figure 8:
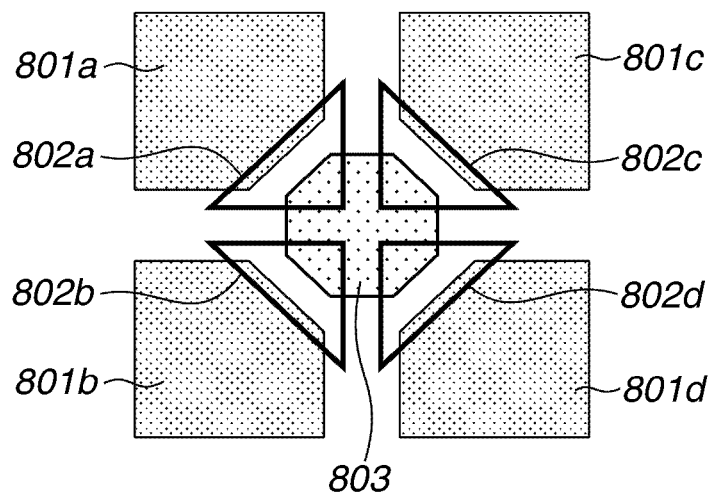
FIG. 8 is a schematic diagram illustrating a planar structure of a pixel unit of a modification of the second exemplary embodiment of the solid-state imaging device according to the present invention.

The number of pixels sharing the FD is not limited to 2. Three or more pixels can share the FD. FIG. 8 illustrates a planar structure of each pixel of the first pixel region in a modification of the present exemplary embodiment. In the modification, four N-type semiconductor regions 801a, 801b, 801c, and 801d are respectively connected via transferring gate electrodes 802a, 802b, 802c, and 802d of transferring transistors to an N-type semiconductor region 803 configuring an FD.

With the configuration in which such four pixels share a common FD, further enhancement of the sensitivity of each pixel, or further miniaturization thereof can be achieved, as compared with the configuration in which two pixels share the common FD.

In the present exemplary embodiment, a configuration similarly to that of the modification of the first exemplary embodiment can be applied to the device. For example, the mesa-type insulator isolation can be used in the element isolation portions of the first pixel region. In addition, the element isolation structure, in which an insulating film due to the EDI isolation or the like is provided in the semiconductor substrate, can be used in the element isolation portions of the first pixel region.

Next, a third exemplary embodiment of the solid-state imaging device to which the present invention is applied is described. In the present exemplary embodiment, the first semiconductor substrate 101 and the second semiconductor substrate 102 are provided across wiring for connecting circuits provided on both of the semiconductor substrates 101 and 102 to face each other. A feature-part of the third exemplary embodiment is that the first semiconductor substrate includes a first peripheral circuit region in which apart of the signal processing circuit is provided at a location other than the first pixel region in which the photoelectric conversion unit is provided. A detailed description of components of the present exemplary embodiment, which are similar to associated components of the first exemplary embodiment, is omitted.

Figure 1B:
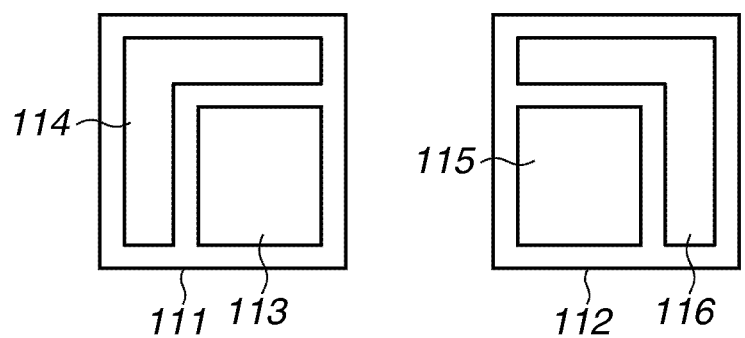
FIG. 1B is a schematic diagram illustrating planar configurations of substrates.

FIG. 1B is a schematic diagram illustrating a planar structure of the first semiconductor substrate and the second semiconductor substrate included in the solid-state imaging device according to the present exemplary embodiment. A first semiconductor substrate 111 includes a first pixel region 113 and a first peripheral circuit region 114. A second semiconductor substrate 112 includes a second pixel region 115 and a second peripheral circuit region 116. No photoelectric conversion units are provided in the first peripheral circuit region 114, the second pixel region 115, and the peripheral circuit region 116. No photoelectric conversion units are provided in the second pixel region 104 and the peripheral circuit region 105. The first semiconductor substrate 101 and the second semiconductor substrate 102 are provided across wiring for connecting the circuits provided on both of the semiconductor substrates to face each other.

Figure 9:
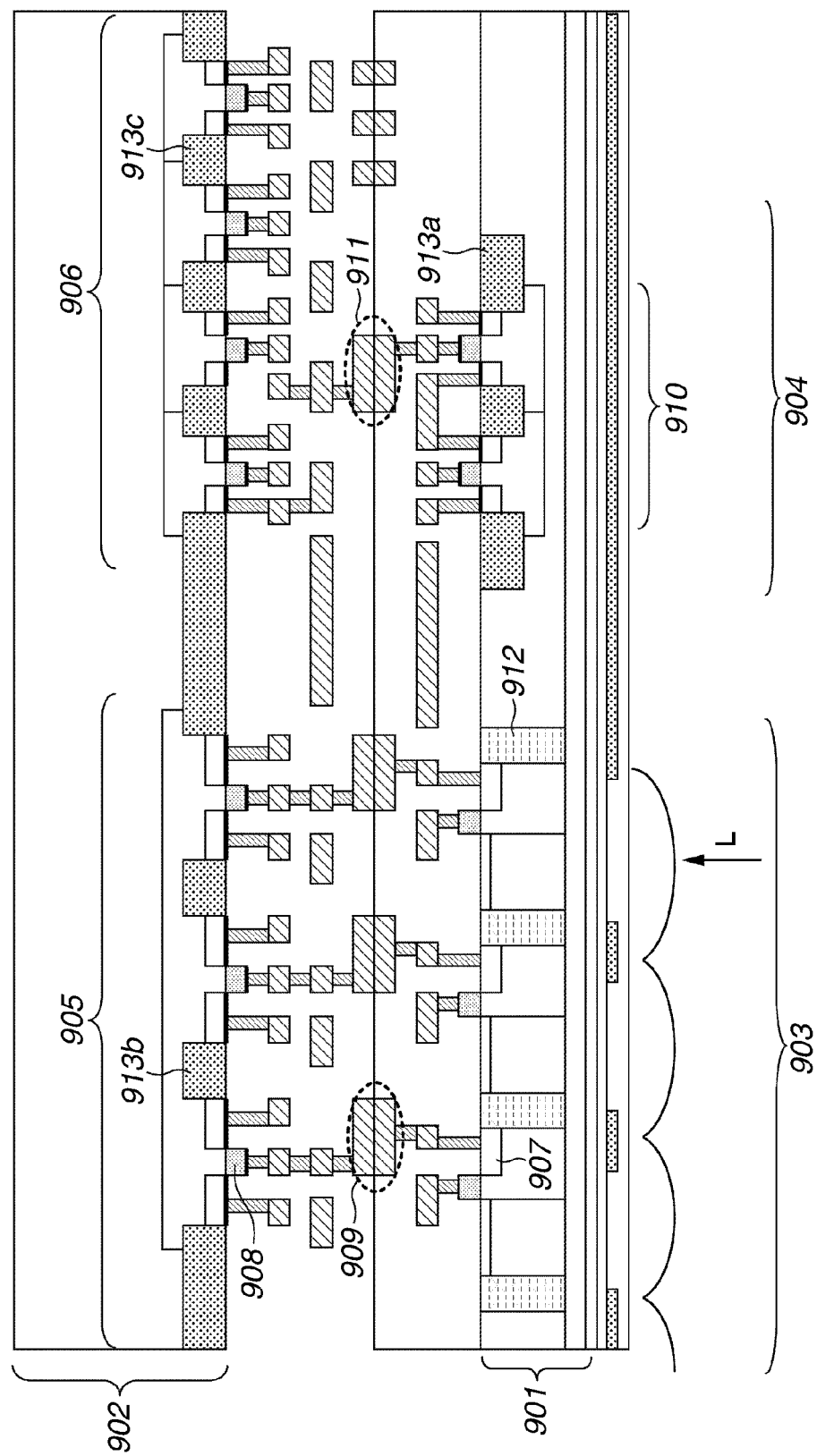
FIG. 9 is a schematic diagram illustrating a cross-sectional structure of a third exemplary embodiment of a solid-state imaging device according to the present invention.

FIG. 9 illustrates a schematic diagram illustrating a cross-sectional structure including the first semiconductor substrate, the second semiconductor substrate, and an electrical connection portion between both of the semiconductor substrates in the solid-state imaging device according to the present exemplary embodiment. A first semiconductor substrate 901 includes a first pixel region 903 and a first peripheral circuit region 904. A second semiconductor substrate 902 includes a second pixel region 905 and a second peripheral circuit region 906.

In FIG. 9, an upper principal surface of the first semiconductor substrate 901 is a first principal surface (front-side surface). A gate electrode of the transferring transistor, and wiring connected to an FD are provided on the first principal surface (front-side surface) side of the first semiconductor substrate 901. A lower principal surface of the first semiconductor substrate 901 is a second principal surface (back-side surface). Arrow L indicates a direction in which light is incident. As indicated by arrow L, light is incident on the photoelectric conversion unit from a second principal surface (back-side surface) side of the first semiconductor substrate 901. A surface (lower principal surface illustrated in FIG. 9) of the second semiconductor substrate 902, on which elements are provided, is a front-side surface of the second semiconductor substrate 902.

In the present exemplary embodiment, the first semiconductor substrate 401 and the second semiconductor substrate 402 are arranged such that the first principal surface (front-side surface) of the first semiconductor substrate 401 faces the second semiconductor substrate 402, and that the front-side surface of the second semiconductor substrate 402 faces the first semiconductor substrate 401. An electrically-conductive pattern including a connection portion (to be described below) is provided between the first semiconductor substrate 401 and the second semiconductor substrate 402. Thus, the first semiconductor substrate 401 and the second semiconductor substrate 402 are arranged across the electrically-conductive pattern to face each other.

In the first pixel region 903, the photoelectric conversion units, the FDs, and the transferring transistors are arranged like a matrix in units of pixels. In the second pixel region 905, the amplifying transistors and the resetting transistors are arranged like a matrix in units of pixels. FIG. 9 illustrates a cross-section of the amplifying transistor as an example. An N-type semiconductor region 907 configuring an FD, and a gate electrode 908 of the amplifying transistor are electrically connected via a connection portion 909 to each other.

In the present embodiment, a part of elements configuring a signal processing circuit is provided in the first peripheral circuit region 904, while another part of the elements is provided in the second peripheral circuit region 906. It is suitable that a circuit 910 for supplying drive pulses to the gate of the transferring transistor, which is included in the vertical shift register, is provided in the first peripheral circuit region 904. Elements provided in the first peripheral circuit region 904 are electrically connected to those provided in the second peripheral circuit region 906 via, e.g., a connection portion 911.

Element isolation portions for electrically isolating pixels arranged like a matrix are provided in the first pixel region 903. Each element isolation portion isolates the photoelectric conversion units of pixels adjoining each other. Alternatively, each element isolation portion isolates the photoelectric conversion unit of a pixel from an FD of another pixel adjacent thereto. Alternatively, the element isolation portion can be configured to isolate FDs of pixels adjoining one another.

In the present exemplary embodiment, the PN isolation is used in the element isolation portions of the first pixel region 903. The P-type semiconductor region 419 is provided between the photoelectric conversion unit and the N-type semiconductor region 907 configuring the FD of the pixel adjacent thereto. The P-type semiconductor region 419 serves as a potential barrier for electrons in the N-type semiconductor region. Thus, the P-type semiconductor region 419 can achieve element isolation.

Any element isolation structure can be used in regions other than the first pixel region 903, i.e., in the first peripheral circuit region 904, the second pixel region 905, and the second peripheral circuit region 906. Preferably, the LOCOS isolation and the STI isolation are used. Alternatively, the PN isolation or the mesa-type insulator isolation can be used. Preferably, an element isolation portion 913a of the first peripheral circuit region, an element isolation portion 913b of the second pixel region, and an element isolation portion 913c of the second peripheral circuit region have the same element isolation structure. However, the element isolation portions 913a, 913b, and 913c can differ from one another in element isolation structure.

In the present exemplary embodiment, a configuration similar to that according to the modification of the first exemplary embodiment can be applied to the device. The mesa-type insulator isolation can be used in the element isolation portions of the first pixel region. An element isolation structure in which an insulating film is provided in the semiconductor substrate can be used in the element isolation portions of the first pixel region.

The present exemplary embodiment has the following advantages in addition to those of the first exemplary embodiment. According to the third exemplary embodiment, the first semiconductor substrate includes the first peripheral circuit region at a location differing from that of the first pixel region. In addition, a part of elements configuring a signal processing circuit are provided in the first peripheral circuit region. With such a configuration, the area of the second peripheral circuit region provided in the second semiconductor substrate can be reduced. Thus, the area of the solid-state imaging device, i.e., a chip area can be reduced.

Next, a fourth exemplary embodiment of the solid-state imaging device to which the present invention is applied is described. A feature-part of the present exemplary embodiment is that one semiconductor substrate includes a first pixel region in which photoelectric conversion portions are provided, and that a second pixel region and a peripheral circuit region are included at a place differing from the first pixel region. Description of components of the present exemplary embodiment, which are similar to associated components of the first through third exemplary embodiments, is omitted.

Figure 1C:
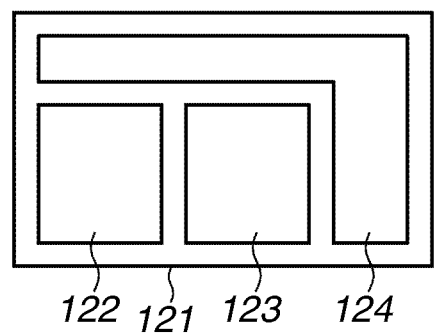
FIG. 1C is a schematic diagram illustrating planar configurations of substrates.

FIG. 1C is a schematic diagram illustrating a planar structure of a semiconductor substrate included in the solid-state imaging device according to the present exemplary embodiment. A semiconductor substrate 121 includes a first pixel region 122, a second pixel region 123, and a peripheral circuit region 124. Photoelectric conversion units are provided in the first pixel region 122. No photoelectric conversion units are provided in the second pixel region 123 and the peripheral circuit region 124.

Figure 10:
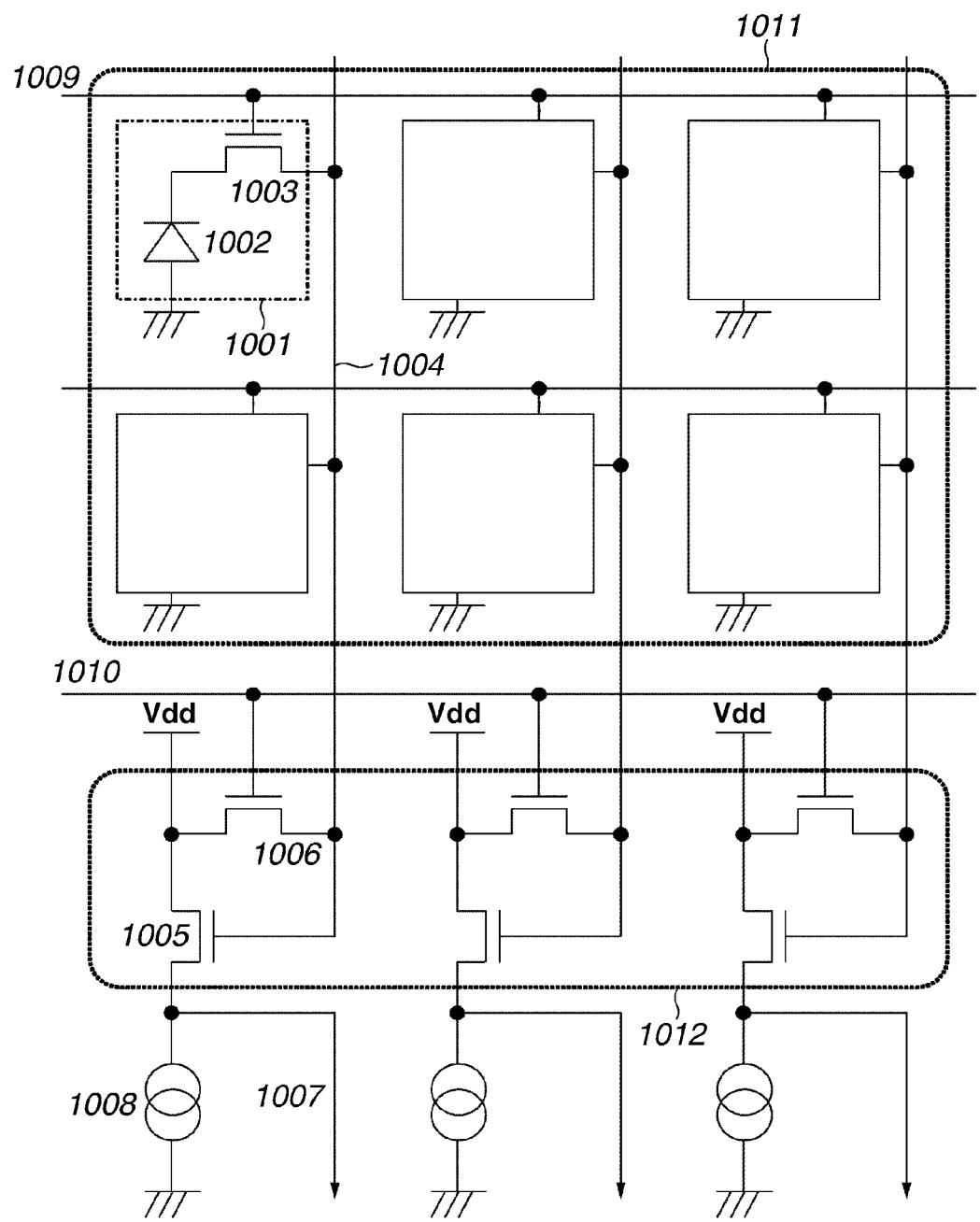
FIG. 10 is an equivalent circuit diagram illustrating an equivalent circuit of each of a pixel unit and a signal processing circuit of a fourth exemplary embodiment of a solid-state imaging device according to the present invention.

FIG. 10 is an equivalent circuit diagram illustrating an equivalent circuit of each pixel according to the present exemplary embodiment. FIG. 10 illustrates six pixels arranged like a matrix with two rows and three columns. However, the number of pixels included in the solid-state imaging device according to the present exemplary embodiment is not limited thereto.

A pixel 1001 includes a photoelectric conversion unit 1002, a transferring transistor 1003, and an FD 1004. An amplifying transistor 1005 and a resetting transistor 1006 are provided in each image column.

FDs 1004 of a plurality of pixels included in a single pixel column are connected to one another, and to a gate of the amplifying transistor 1005. A drain of the amplifying transistor 1005 is connected to a power supply. A source of the amplifying transistor 1005 is connected to a vertical output line 1007. A drain of the resetting transistor 1006 is connected to the power supply. A source of the resetting transistor 1006 is connected to the FD 1004. A constant current source 1008 is connected to the vertical output line 1007. The amplifying transistor 1005 and the constant current source 1008 connected thereto configure a source follower circuit. A control line 1010 is connected to a transferring transistor 1002. A control line 1010 is connected to the gate of the resetting transistor 1006. A signal processing circuit (not shown) is provided at a subsequent stage of the vertical output line 1007.

In the present embodiment, elements surrounded by dashed lines 1001 are provided in the first pixel region 122 illustrated in FIG. 1C. Elements surrounded by dashed lines 1012 are provided in the second pixel region 123 illustrated in FIG. 1C. Thus, no transistors other than the transferring transistor 1003 are provided in the first pixel region 122 in which a plurality of photoelectric conversion portions are arranged. The amplifying transistors 1005 and the resetting transistors 1006 are provided in the second pixel region 123 other than the first pixel region 122 in which a plurality of photoelectric conversion units are arranged.

Figure 11:
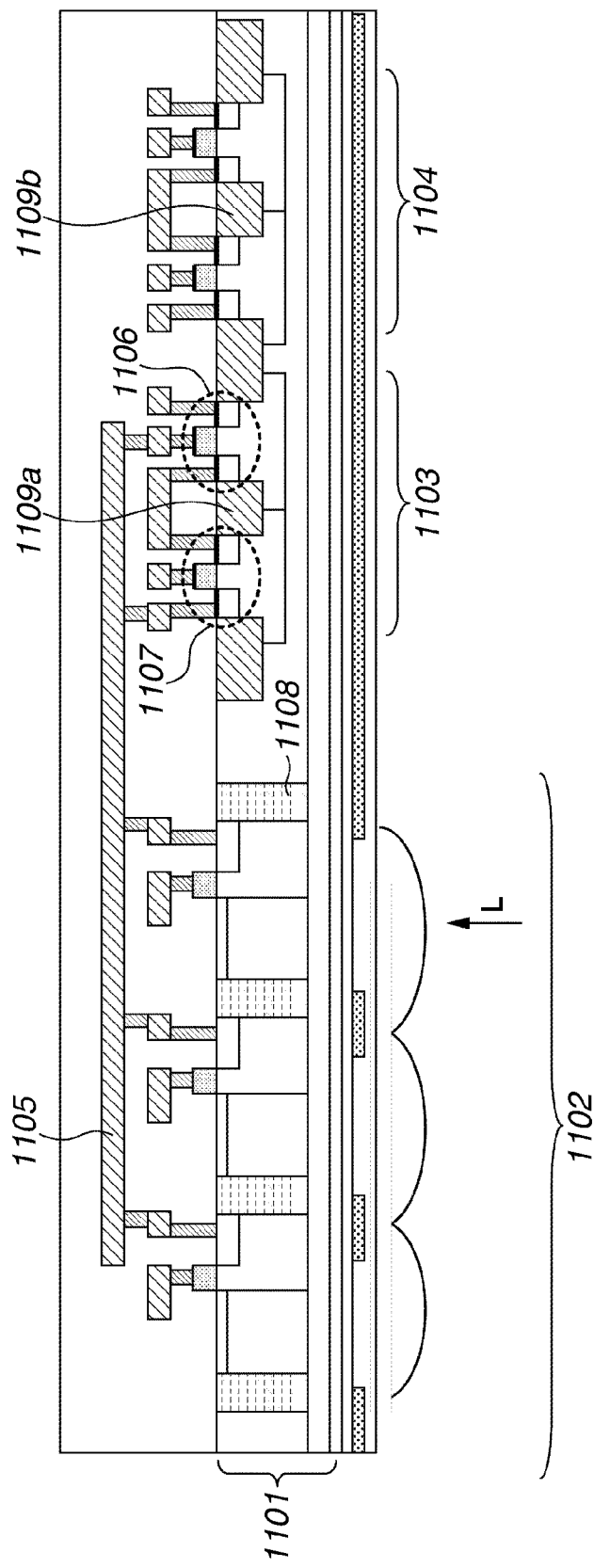
FIG. 11 is a schematic diagram illustrating a cross-sectional structure of the fourth exemplary embodiment of the solid-state imaging device according to the present invention.

FIG. 11 is a schematic diagram illustrating a cross-sectional structure of the semiconductor substrate in the solid-state imaging device according to the present exemplary embodiment. A semiconductor substrate 1101 includes a first pixel region 1102, a second pixel region 1103, and a peripheral circuit region 1104.

In FIG. 11, a principal surface on a side (upper side as viewed in FIG. 11), on which wiring of the semiconductor substrate 1101 is provided, is a first principal surface (front-side surface). Arrow L indicates a direction in which light is incident. As indicated by arrow L, light is incident from a second principal surface (back-side surface) opposite to the first principal surface (front-side surface) of the semiconductor substrate 1101.

Photoelectric conversion units, FDs, and transferring transistors are provided in the first pixel region 1102. In the second pixel region 1103, the amplifying transistors 106 and the resetting transistors 107 are provided. FDs of a plurality of pixels included in a single pixel column are connected to common wiring 1105. The common wiring 1105 is connected to a gate electrode of the amplifying transistor 1106. A source of the resetting transistor 1107 is connected to the common wiring 1105. Elements configuring a signal processing circuit are provided in the peripheral circuit region 1104.

Element isolation portions for electrically isolating a plurality of pixels arranged like a matrix from one another are provided in the first pixel region 1102. Each element isolation portion isolates the photoelectric conversion units of pixels adjoining each other. Alternatively, each element isolation portion isolates the photoelectric conversion unit of a pixel from an FD of another pixel adjacent thereto. Alternatively, the element isolation portion can be configured to isolate FDs of pixels adjoining one another.

The PN isolation is used in the element isolation portions of the first pixel region 1102. The P-type semiconductor region 1108 is provided between the photoelectric conversion unit and the FD of the pixel adjacent thereto in the cross-section illustrated in FIG. 11. The P-type semiconductor region 1108 serves as a potential barrier for electrons in the N-type semiconductor region. Thus, the P-type semiconductor region 1108 can achieve element isolation.

Any element isolation structure can be used in regions other than the first pixel region 1102, i.e., in the element isolation portions 1109 provided in the second pixel region 1103, and the peripheral circuit region 1104. Preferably, the LOCOS isolation and the STI isolation are used. Alternatively, the PN isolation or the mesa-type insulator isolation can be used. Preferably, an element isolation portion 1109a of the second pixel region, and an element isolation portion 1109b of the peripheral circuit region have the same element isolation structure. However, the element isolation portions 1109a and 1109b can differ from one another in element isolation structure.

In the present exemplary embodiment, a configuration similar to that according to the modification of the first exemplary embodiment can be applied to the device. The PN isolation and the mesa-type insulator isolation can be used therein. An element isolation structure in which an insulating film is provided in the semiconductor substrate can be used in the element isolation portions of the first pixel region.

The present exemplary embodiment has the following advantages in addition to those of the first exemplary embodiment. According to the fourth exemplary embodiment, one semiconductor substrate includes the first pixel region in which the photoelectric conversion units are provided, and the second pixel region and the peripheral circuit region, which are located at places differing from the first pixel region. In addition, an element isolation structure in which an insulating film is provided in the semiconductor substrate is not used in the first pixel region. With such a configuration, in the process of manufacturing the solid-state imaging device, a step of arranging two semiconductor substrates to face each other, and connecting the two semiconductor substrates is unnecessary. Consequently, the process of manufacturing the solid-state imaging device can be simplified.

In the above first through fourth exemplary embodiments, the back-side surface irradiation type solid-state imaging device has been described as an example. However, the present invention can be applied to a front-side surface irradiation type solid-state imaging device.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

The invention claimed is:

1. A solid-state imaging device comprising:
   a plurality of pixels, the pixel including
      a photoelectric conversion unit including a first semiconductor region of a first conductivity type
      a floating diffusion region,
      a transfer transistor including a transferring gate electrode configured to transfer signal charge generated at the photoelectric conversion unit to the floating diffusion region,
      a transistor having a gate electrode connected to the floating diffusion region, and
      a reset transistor configured to reset a voltage of the floating diffusion region;
   a signal processing circuit for processing a signal output from the plurality of pixels;
   a first semiconductor substrate; and
   a second semiconductor substrate,
   wherein
   the first semiconductor substrate includes a pixel region;
   a plurality of the photoelectric conversion units and a plurality of the floating diffusion regions are arranged in the pixel region;
   a first element isolation portion is provided in the pixel region, configured to electrically isolate at least a part of the plurality of the photoelectric conversion units and at least a part of the plurality of the floating diffusion regions;

the first element isolation portion includes a second semiconductor region of a second conductivity type which contacts a first insulating film disposed on a first surface of the first semiconductor substrate and a second insulating film disposed on a second surface of the first semiconductor substrate, the second surface being opposite to the first surface, the second semiconductor substrate includes a circuit region;

a plurality of transistors included in the signal processing circuit are arranged in the circuit region;

a second element isolation portion is arranged in the circuit region, configured to electrically isolate at least a part of the plurality of transistors; and the second element isolation portion includes an insulator portion.

2. The solid-state imaging device according to claim 1, further comprising:

an electrically-conductive pattern configured to electrically connect the floating diffusion region and the gate electrode of the transistor, wherein the first surface of the first semiconductor substrate faces the second semiconductor substrate, the electrically-conductive pattern being interposed between the first surface of the first semiconductor substrate and the second semiconductor substrate, and light is incident on the first semiconductor substrate from the second surface.

3. The solid-state imaging device according to claim 2, wherein the second semiconductor region includes a first part extending along the first surface and a second part extending along the second surface, and the first semiconductor region is arranged between the first part and the second part.

4. The solid-state imaging device according to claim 3, wherein the first semiconductor substrate has a thickness where a part of the light reaches the first surface of the first semiconductor substrate, and the first principal surface of the first semiconductor substrate includes a (1 0 0)-surface.

5. The solid-state imaging device according to claim 4, wherein the floating diffusion region has a higher impurity concentration than an impurity concentration of the first semiconductor region.

6. The solid-state imaging device according to claim 5, the plurality of transistors included in the signal processing circuit includes a silicide formed thereon.

7. The solid-state imaging device according to claim 1, wherein the floating diffusion region has a higher impurity concentration than an impurity concentration of the first semiconductor region, wherein the plurality of pixels form a matrix including a plurality of pixel columns, wherein the signal processing circuit includes a plurality of analog-to-digital convertors respectively corresponding to the plurality of pixel columns, wherein the first surface of the first semiconductor substrate includes a (1 0 0)-surface, the plurality of transistors included in the signal processing circuit includes a silicide formed thereon, wherein the first element isolation portion includes a PN isolation, wherein a reverse bias voltage is applied to a PN junction of the PN isolation, and wherein the solid-state imaging device further comprises a contact plug configured to supply the reverse bias voltage to the PN isolation, wherein the first semiconductor substrate has a thickness where a part of the light reaches the first principal surface of the first semiconductor substrate.

8. The solid-state imaging device according to claim 7, further comprising:

a light shielding portion provided on the second principal surface of the first semiconductor substrate;

a color filter provided on the second principal surface; and a microlens provided on the second principal surface.

9. A solid-state imaging device comprising:

a plurality of pixels, the pixel including
a photoelectric conversion unit,
a floating diffusion region,
a transferring transistor including a transferring gate electrode configured to transfer signal charge generated at the photoelectric conversion unit to the floating diffusion region,
an amplifying transistor configured to output a signal based on an amount of electric charge of the floating diffusion region, and
a resetting transistor configured to reset a voltage of the floating diffusion region;

a signal processing circuit for processing a signal output from the plurality of pixels;

a first semiconductor substrate; and a second semiconductor substrate, wherein a first insulating film is provided on a first principal surface of the first semiconductor substrate, wherein the first semiconductor substrate includes a pixel region;

wherein a plurality of photoelectric conversion units and a plurality of floating diffusion regions are arranged in the pixel region;

wherein a first element isolation portion is provided in the pixel region, configured to electrically isolate at least a part of the plurality of photoelectric conversion units and at least a part of the plurality of floating diffusion regions;

wherein a second insulating film is provided on the second semiconductor substrate;

wherein the second semiconductor substrate includes a circuit region;

wherein a plurality of transistors included in the signal processing circuit are arranged in the circuit region;

wherein a second element isolation portion is arranged in the circuit region, configured to electrically isolate at least a part of the plurality of transistors;

wherein an interface between the first semiconductor substrate and the first insulating film is flat;

wherein an interface of a region where the second element isolation portion is provided, between the second semiconductor substrate and the second insulating film, is arranged at a first depth with respect to an interface of a region where the transistor included in the signal processing circuit is arranged, between the second semiconductor substrate and the second insulating film; and wherein the first depth is larger than zero.

10. The solid-state imaging device according to claim 9, wherein light is incident on the first semiconductor substrate from a second principal surface side thereof, the second principal surface being opposite to the first principal surface of the first semiconductor substrate.

11. The solid-state imaging device according to claim 10, further comprising:
an electrically-conductive pattern configured to electrically connect the floating diffusion region and a gate electrode of the amplifying transistor,
wherein the first principal surface of the first semiconductor substrate faces a principal surface of the second semiconductor substrate on which the gate electrode of the amplifying transistor is arranged, the electrically-conductive pattern being interposed therebetween.

12. The solid-state imaging device according to claim 11, wherein the first element isolation portion is one of PN isolation, mesa-type insulator isolation, and EDI isolation, and wherein the second element isolation portion is one of LOCOS isolation and STI isolation.

13. The solid-state imaging device according to claim 12, wherein the first principal surface of the first semiconductor substrate includes a (1 0 0)-surface.

14. The solid-state imaging device according to claim 13,
wherein the plurality of pixels form a matrix including a plurality of pixel columns,
wherein the signal processing circuit includes a plurality of column circuits respectively corresponding to the plurality of pixel columns, and
wherein the column circuit includes an analog-to-digital convertor.

15. The solid-state imaging device according to claim 9, wherein the photoelectric conversion unit includes:
a first semiconductor region of a first conductivity type configured to collect a signal charge,
a second semiconductor region of a second conductivity type provided between the first semiconductor region and the first principal surface of the first semiconductor substrate, and
a third semiconductor region of the second conductivity type provided between the first semiconductor region and a second principal surface being opposite to the first principal surface of the first semiconductor substrate, and
wherein the first, second and third semiconductor regions forms an embedded-type photodiode.

16. The solid-state imaging device according to claim 15,
wherein the floating diffusion region has a higher impurity concentration than an impurity concentration of the first semiconductor region, and
wherein the second semiconductor region has a higher impurity concentration than an impurity concentration of the first element isolation portion.

17. The solid-state imaging device according to claim 16,
wherein the transferring transistor includes a channel region implanted with a channel impurity, and
wherein a negative voltage is applied to the transferring gate electrode during an exposure time period.

18. The solid-state imaging device according to claim 17, wherein the transistor included in the signal processing circuit includes a silicide formed thereon.

19. The solid-state imaging device according to claim 18, further comprising:
a contact plug configured to supply the reverse bias voltage to the PN isolation.

20. The solid-state imaging device according to claim 19, further comprising:
a light shielding portion provided on a second principal surface being opposite to the first principal surface of the first semiconductor substrate;
a color filter provided on the second principal surface; and
a microlens provided on the second principal surface.

* * * * *